(12) United States Patent
Chandra et al.

(10) Patent No.: US 11,585,864 B2
(45) Date of Patent: Feb. 21, 2023

(54) HIGH-SPEED SIGNAL SUBSYSTEM TESTING SYSTEM

(71) Applicant: Dell Products L.P., Round Rock, TX (US)

(72) Inventors: Umesh Chandra, Santa Cruz, CA (US); Bhyrav Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/336,659

(22) Filed: Jun. 2, 2021

(65) Prior Publication Data
US 2022/0390527 A1  Dec. 8, 2022

(51) Int. Cl.
*G01R 31/58* (2020.01)
(52) U.S. Cl.
CPC .................. *G01R 31/58* (2020.01)
(58) Field of Classification Search
CPC ............. G01R 31/58; G01R 31/66–31/70
See application file for complete search history.

(56) References Cited

U.S. PATENT DOCUMENTS

| | | | |
|---|---|---|---|
| 2003/0156545 A1* | 8/2003 | Shimanouchi | G01R 31/2844 370/241 |
| 2014/0009179 A1* | 1/2014 | Li | G11C 29/022 324/750.01 |
| 2016/0216317 A1* | 7/2016 | Chen | H04B 17/29 |

* cited by examiner

*Primary Examiner* — Feba Pothen
(74) *Attorney, Agent, or Firm* — Joseph Mencher

(57) ABSTRACT

A high-speed signal subsystem testing system tests a processor transmitter and receiver coupled to a connector via a transmitter trace and a receiver trace, respectively. A transmitter test circuit on a testing board coupled to the connector compares a transmitter voltage received from the transmitter via the transmitter trace and the connector to a common mode voltage range and, in response to the transmitter voltage being outside the common mode voltage range, provides a transmitter trace issue signal. A receiver test circuit on the testing board coupled to the connector transmits a first test voltage towards the receiver, compares a second test voltage detected at the receiver test circuit in response to transmitting the first test voltage towards the receiver to a reference test voltage and, in response to the second test voltage being above the reference test voltage, provides a receiver trace issue signal.

20 Claims, 18 Drawing Sheets

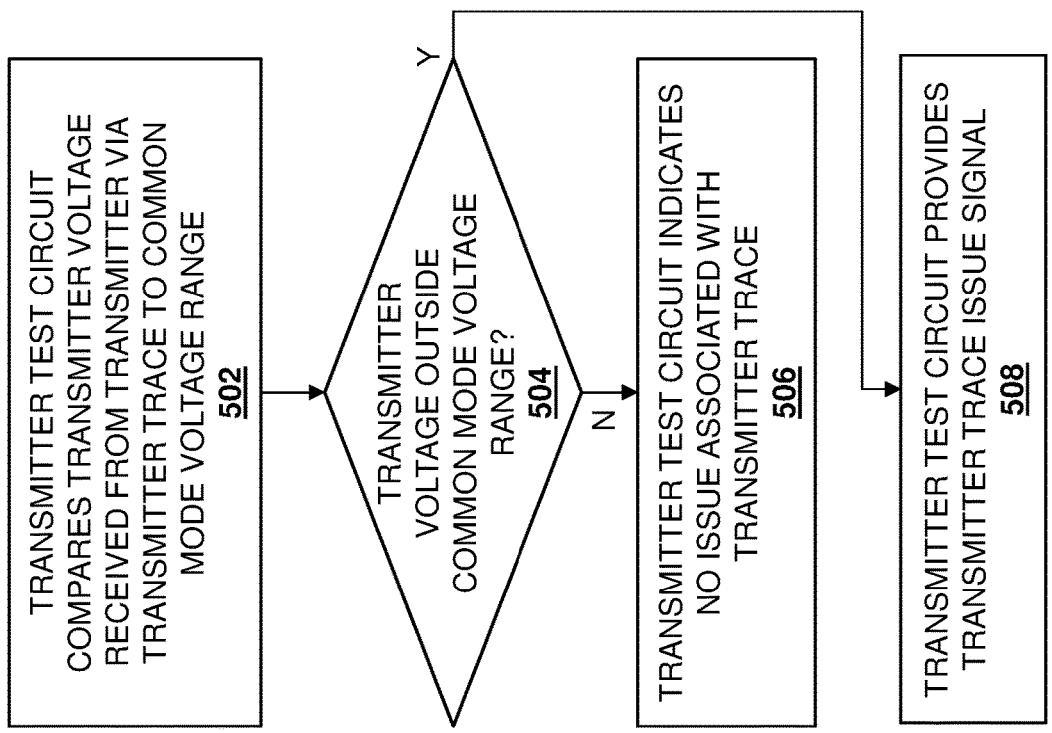

HIGH-SPEED SIGNAL SUBSYSTEM TESTING SYSTEM

BACKGROUND

The present disclosure relates generally to information handling systems, and more particularly to testing high-speed signal subsystems in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, switch devices and/or other networking devices known in the art, are utilized to transmit signals, and it is desirable to test the signaling subsystems in the switch device to ensure they will operate to properly transmit signals during operation. For example, conventional In-Circuit Test (ICT) systems may be utilized to test signaling subsystems in switch devices that provide the connections between a Network Processing Unit (NPU) and switch ports (e.g., provided by Quad Small Form-factor Pluggable (QSFP) transmitter device connectors) in the switch device, but suffer from several issues. For example, in order to allow a conventional ICT with the power turned on or off to the switch device, Surface Mount Technology (SMT) test point pads are often provided on the circuit board in the switch device on either end of a trace that is to-be tested on the circuit board, or on either end of a component (e.g., a resistor) that is to-be tested, in order to allow ICT probes to engage those SMT test point pads and perform the test.

However, traces may be provided as buried stripline traces that extend between a SMT connector for a switch port on the circuit board and an NPU Ball Grid Array (BGA) pad on the circuit board, and that stripline trace may be run with either a blind via or a backdrilled via. As will be appreciated by one of skill in the art, such signaling subsystem configurations prevents access by the ICT probes to the stripline trace (e.g., due to the backdrilled via) or the SMT connector (e.g., due to a "belly-to-belly" cage on the SMT connector), while the NPU will block access to the NPU BGA pad and breakout vias when that NPU is mounted to the circuit board. As such, SMT test point pads may only be provided for the accessible portions of the stripline trace connection and outside the NPU footprint and switch port footprint, and are limited to providing testing that does not determine the integrity of the soldered NPU BGA pad connection or the soldered switch port connection. Furthermore, the placement of such SMT test point pads on the circuit board can result in reflections, insertion losses, and return losses when the circuit board and its traces are used to transmit high-speed signals (e.g., via differential trace pairs), and thus such SMT test pad techniques are not utilized with high-speed differential traces on circuit boards that are utilized to transmit high-speed signals (e.g., 3 GB/s to 28 GB/s Non-Return to Zero signals, 56 GB/s to 112 GB/s Pulse Amplitude Modulation 4 (PAM4) signals, and/or other high-speed signals known in the art). As such, conventional ICTs are limited to relatively lower speed differential traces and single ended signals, and Joint Test Action Group (JTAG) testing techniques suffer from similar limitations.

Conventional solutions to such issues provide for signal testing of the final, fully assembled switch device by configuring a testing system with loopback modules connected to each of the connections (e.g., QSFP DD ports) that are coupled to the transmitters and receivers in the switch device, and then running a system test (e.g., a Pseudo Random Binary Sequence (PRBS) traffic test) and identifying packet drops to detect when a particular switch connection (e.g., QSFP DD port) is experiencing issues transmitting or receiving signals. In the event an issue is identified with a particular switch connection (e.g., QSFP DD port) during testing, that issue may be assumed to be associated with the NPU transmitter, the NPU receiver, the connection of the NPU to the BGA pad, the transmitter differential trace pair to the QSFP DD connector, the receiver differential trace pair to the QSFP DD connector, the connection of the QSFP DD connector to the circuit board, or a bent pin on the QSFP DD connector. Furthermore, while a particular differential trace pair may be identified as having an issue, such conventional solutions do not allow for a determination of whether the issue is associated with the positive or negative trace in that differential trace pair. The switch device must then be disassembled, the circuit board replaced, and the software reinstalled so that the testing may be performed again. As will be appreciated by one of skill in the art, such solutions are time consuming and costly, are often not worthwhile to perform, and can result in the provisioning of switch devices with signaling issues to a customer.

Accordingly, it would be desirable to provide a high-speed signal subsystem testing system that addresses the issues discussed above.

SUMMARY

According to one embodiment, an Information Handling System (IHS) includes a testing board; a first transmitter test circuit that is included on the testing board and that is configured to couple to a transmitter in a processing system on a circuit board via a connector and a first transmitter trace that are included on the circuit board, wherein the first transmitter test circuit is configured to: compare a first transmitter voltage received from the transmitter via the first transmitter trace and the connector to a common mode voltage range; and provide, in response to the first transmitter voltage received via the first transmitter trace being outside the common mode voltage range, a first transmitter trace issue signal that is configured to indicate an issue associated with the first transmitter trace; a first receiver test circuit that is included on the testing board and that is configured to couple to a receiver in the processing system on the circuit board via the connector and a first receiver trace that are included on the circuit board, wherein the first receiver test circuit is configured to: generate a first test voltage and transmit the first test voltage towards the first receiver trace coupled to the connector; compare, to a reference test voltage, a second test voltage that is detected at the first receiver test circuit in response to generating and transmitting the first test voltage towards the first receiver trace coupled to the connector; and provide, in response to the second test voltage being above the reference test voltage, a first receiver trace issue signal that is configured to indicate an issue associated with the first receiver trace.

BRIEF DESCRIPTION OF THE DRAWINGS

FIG. 5 is a flow chart illustrating an embodiment of a method for testing high-speed signaling subsystems.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
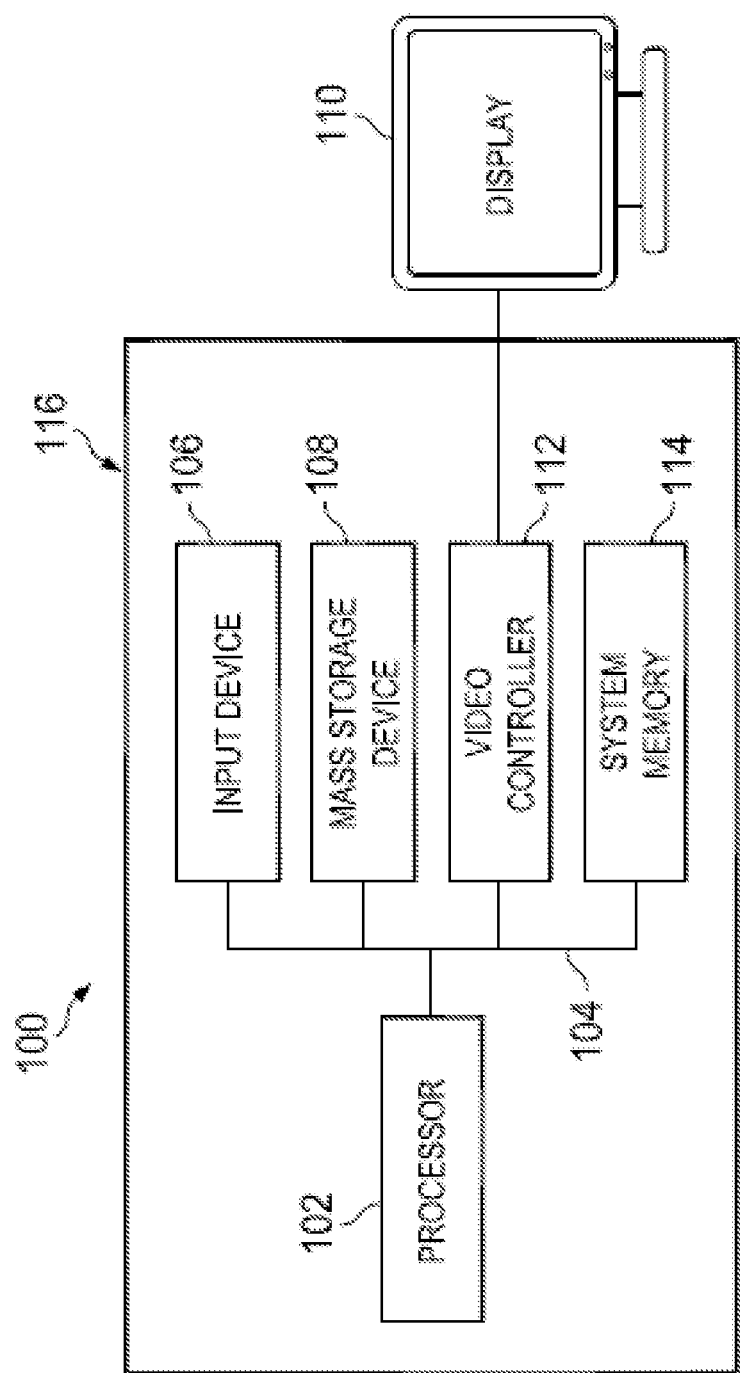
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
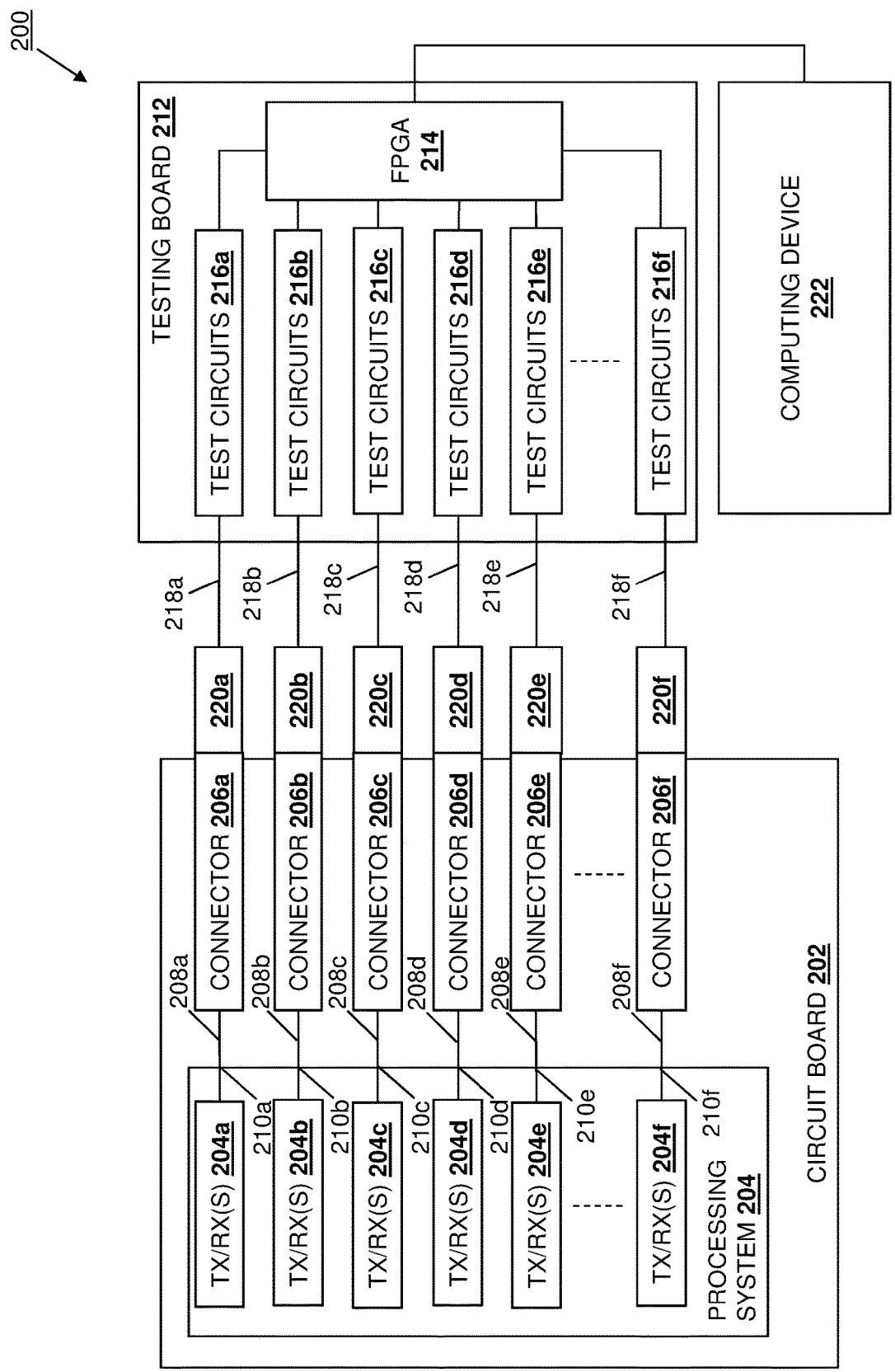
FIG. 2 is a schematic view illustrating an embodiment of a high-speed signal subsystem testing system.

Referring now to FIG. 2, an embodiment of a high-speed signal subsystem testing system 200 is illustrated. In the illustrated embodiment, the high-speed signal subsystem testing system 200 includes a circuit board 202. In an embodiment, the circuit board 202 may be configured to be provided in the IHS 100 discussed above with reference to FIG. 1, may include some or all of the components of the IHS 100, and in the specific examples below is described as being configured to be provided in a switch device or other networking device known in the art. However, while illustrated and discussed as being configured to be provided in a switch device, one of skill in the art in possession of the present disclosure will recognize that circuit boards tests using the high-speed signal subsystem testing system 200 of the present disclosure may include any of a variety of circuit boards configured for provisioning in any of a variety of devices while remaining within the scope of the present disclosure as well. In the illustrated embodiment, the circuit board includes a processing system 204 that, in the examples described below, is provided by a Network Processing Unit (NPU), but that one of skill in the art in possession of the present disclosure will recognize may be provided by other processing systems while remaining within the scope of the present disclosure as well. As discussed below, the processing system 204 may be mounted (e.g., soldered) to the circuit board via BGA pads (e.g., the NPU BGA pads in the example below).

In the illustrated embodiment, the processing system includes a plurality of transmitter/receivers (TX/RX(S)) 204a, 204b, 204c, 204d, 204e, and up to 204f. Furthermore, the circuit board 202 also includes a plurality of connectors 206a, 206b, 206c, 206d, 206e, and up to 206f, each of which may be mounted (e.g., soldered) to the circuit board 202 (e.g., via the SMT connectors discussed above). As illustrated, each of the connectors 206a-206f may be coupled to respective transmitter/receiver(s) 204a-204f by respective traces that extend through the circuit board 202 between that connector and a BGA pad to which the processing system 204 is mounted and to which its transmitter/receiver(s) are coupled. As such, the connector 206a is coupled to the transmitter/receiver(s) 204a by traces 208a extending between the connector 206a and the BGA pad 210a that is coupled to the transmitter/receiver(s) 204a in the processing system 204, the connector 206b is coupled to the transmitter/receiver(s) 204b by traces 208b extending between the connector 206b and the BGA pad 210b that is coupled to the transmitter/receiver(s) 204b in the processing system 204, the connector 206c is coupled to the transmitter/receiver(s) 204c by traces 208c extending between the connector 206c and the BGA pad 210c that is coupled to the transmitter/receiver(s) 204c in the processing system 204, the connector 206d is coupled to the transmitter/receiver(s) 204d by traces 208d extending between the connector 206d and the BGA pad 210d that is coupled to the transmitter/receiver(s) 204d in the processing system 204, the connector 206e is coupled to the transmitter/receiver(s) 204e by traces 208e extending between the connector 206e and the BGA pad 210e that is coupled to the transmitter/receiver(s) 204e in the processing system 204, and the connector 206f is coupled to the transmitter/receiver(s) 204f by traces 208f extending between the connector 206f and the BGA pad 210f that is coupled to the transmitter/receiver(s) 204f in the processing system 204.

In a specific example, the circuit board 202 may include 32 Quad Small Form-factor Pluggable (QSFP) Double Density (DD) ports that provide the connectors 206a-206f, with each QSFP DD port connected via 8 transmitter differential trace pairs (e.g., 8 sets of positive/negative transmitter traces) to the NPU, and via 8 receiver differential trace pairs (e.g., 8 sets of positive/negative receiver traces) to the NPU, thus providing (8*2*32=) 512 transmitter traces and (8*2*32=) 512 receiver traces on the circuit board 202 (e.g., the trace(s) 208a-208f). Furthermore, the circuit board 202 may be configured to transmits signals at speeds of 56G using a PAM4 format which, as discussed above, prevents testing of the differential trace pairs on the circuit board 202 during a powered-on portion of an ICT or JTAG test. However, while a particular circuit board 202 with 32 connectors and 1024 traces is discussed in the examples below, one of skill in the art in possession of the present disclosure will appreciate how circuit boards may utilize more connectors (e.g., 64 connectors) and more traces (e.g., 2048 traces), or fewer connectors (e.g., 16 connectors) and fewer traces (e.g., 512 traces) while remaining within the scope of the present disclosure as well.

In the illustrated embodiment, the high-speed signal subsystem testing system 200 also includes a testing board 212 having a logic device that is mounted (e.g., soldered) to the testing board 212 and that is illustrated and described in the examples below as a Field Programmable Gate Array (FPGA) 214, but that one of skill in the art in possession of the present disclosure will appreciate may be provided by any of a variety of logic devices known in the art that are configured to operate like the FPGA 214 described below. In the illustrated embodiment, the testing board 212 includes a plurality of test circuits 216a, 216b, 216c, 216d, 216e, and up to 216f, each of which are coupled to the FPGA 214. Furthermore, as illustrated and described below, each of the test circuits 216a-216f may be cabled to a connector that may be engaged with a respective connector 206a-206f on the circuit board 202. For example, the test circuits 216a may be coupled via a cable 218a to a connector 220a that engages the connector 206a on the circuit board 202, the test circuits 216b may be coupled via a cable 218b to a connector 220b that engages the connector 206b on the circuit board 202, the test circuits 216c may be coupled via a cable 218c to a connector 220c that engages the connector 206c on the circuit board 202, the test circuits 216d may be coupled via a cable 218d to a connector 220d that engages the connector 206d on the circuit board 202, the test circuits 216e may be coupled via a cable 218e to a connector 220e that engages the connector 206e on the circuit board 202, and the test circuits 216f may be coupled via a cable 218f to a connector 220f that engages the connector 206f on the circuit board 202.

Continuing with the example above in which the circuit board 202 includes 32 QSFP DD ports that provide the connectors 206a-206f, the connectors 220a-220f may be provided by 32 QSFP DD male connectors, and the cables 218a-218f may be 32 cables configured to transmit data to and from the QSFP DD ports/connectors. However, one of skill in the art in possession of the present disclosure will recognize how the testing board 212 may be configured to allow the test circuits 216a-216f to connect to QSFP28 ports, Small Form-factor Pluggable (SFP) DD ports, SFP+ ports, and/or any other high-speed data ports that would be apparent to one of skill in the art in possession of the present disclosure. As illustrated, the FPGA 214 may be coupled to a computing device 222 such as a desktop computing device, a laptop/notebook computing device, a tablet computing device, a mobile phone, and/or any other computing device that one of skill in the art in possession of the present disclosure will recognize as being configured to perform the functionality of the computing device 222 discussed below. However, while a specific high-speed signal subsystem testing system 200 has been illustrated and described, one of skill in the art in possession of the present disclosure will recognize that the high-speed signal subsystem testing system of the present disclosure may include a variety of components and component configurations while remaining within the scope of the present disclosure as well.

Figure 3:
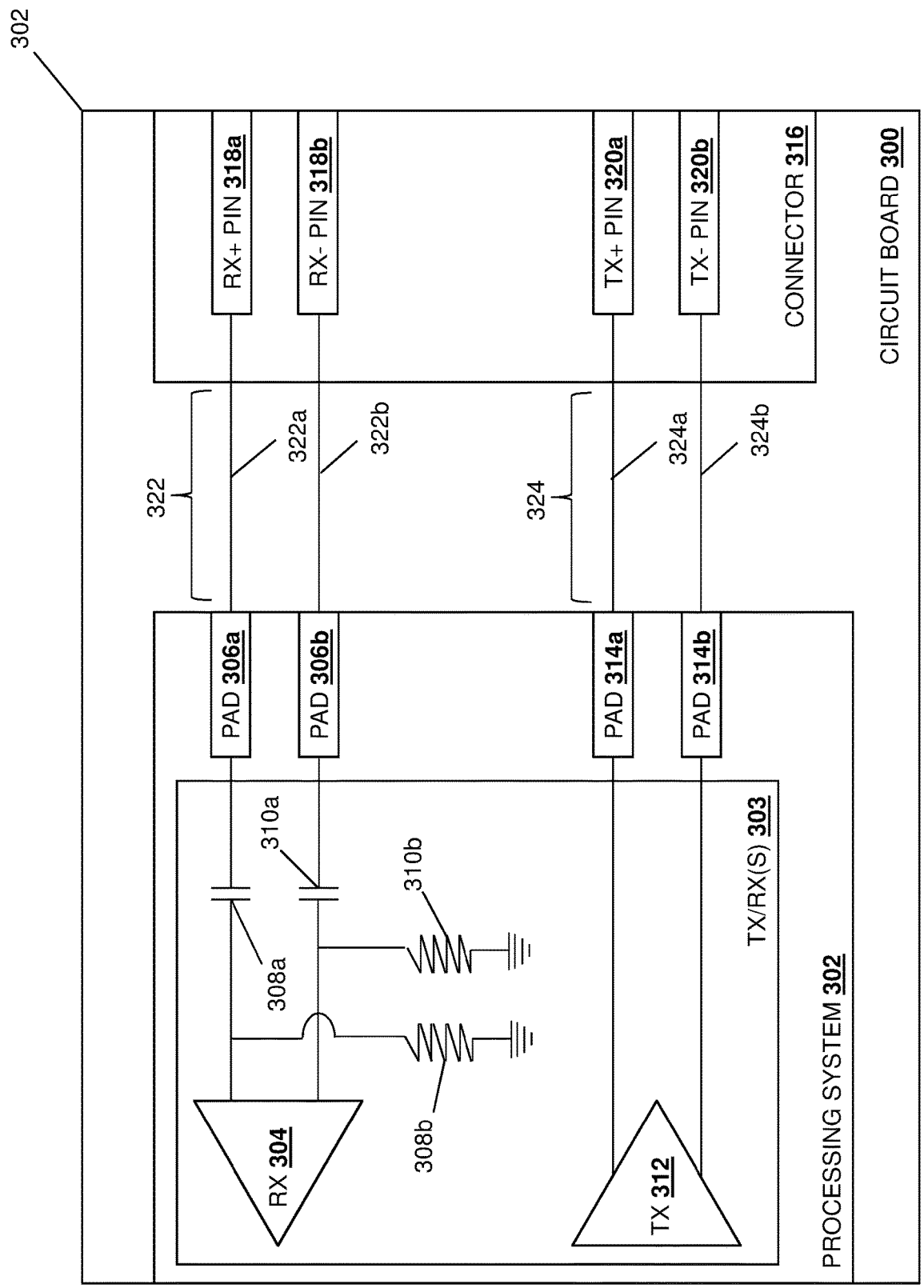
FIG. 3 is a schematic view illustrating an embodiment of a circuit board that may be included in the high-speed signal subsystem testing system of FIG. 2.

Referring now to FIG. 3, an embodiment of a circuit board 300 is illustrated that may provide a portion of the circuit board 202 discussed above with reference to FIG. 2. In the illustrated example, the circuit board 300 includes transmitter/receiver(s) 303 that may be included in any of the transmitter/receiver(s) 204a-204f discussed above with reference to FIG. 2. For example, the transmitter/receiver 303 includes a receiver (RX) 304 that is coupled to pads 306a and 306b (e.g., the BGA pads discussed above that mount the processing system 302 to the circuit board 300), with coupling between the receiver 304 and the pad 306a including a capacitor 308a and a resistor 308b that is coupled to ground, and with the coupling between the receiver 304 and the pad 306b including a capacitor 310a and a resistor 310b that is coupled to ground. In the examples below, the resistors 308b and 310b are provided with a resistance of 50 ohms, but one of skill in the art in possession of the present disclosure will appreciate how other resistances will fall within the scope of the present disclosure as well. The transmitter/receiver 303 also includes a transmitter (TX) 312 that is coupled to pads 314a and 314b (e.g., the BGA pads discussed above that mount the processing system 302 to the circuit board 300).

Furthermore, the circuit board 300 also includes a connector 316 that may be any of the connectors 206a-206f discussed above with reference to FIG. 2, and that includes a positive receiver (RX+) pin 318a, a negative receiver (RX-) pin 318b, a positive transmitter (TX+) pin 320a, and a negative transmitter (TX-) pin 320b. As illustrated, the positive receiver pin 318a and the negative receiver pin 318b are coupled to a receiver differential trace pair 322, with a positive receiver trace 322a extending between the pad 306a and the positive receiver pin 318a, and a negative receiver trace 322b extending between the pad 306b and the negative receiver pin 318b. In the specific examples, below, each of the positive receiver trace 322a and the negative receiver trace 322b provide a resistance of 50 ohms, but one of skill in the art in possession of the present disclosure will appreciate how different trace resistances will fall within the scope of the present disclosure as well. Similarly, the positive transmitter pin 320a and the negative transmitter pin 320b are coupled to a transmitter differential trace pair 324, with a positive transmitter trace 324a extending between the pad 314a and the positive transmitter pin 320a, and a negative receiver trace 324b extending between the pad 314b and the negative transmitter pin 320b. However, while the circuit board 300 illustrated in FIG. 3 is used below to describe the testing of the single receiver differential trace pair 322 associated with the receiver 304 and the single transmitter differential trace pair 324 associated with the transmitter 312, as discussed above and as will be appreciated by one of skill in the art in possession of the present disclosure, the connector 316 may be coupled via several transmitter differential trace pairs and receiver differential trace pairs to transmitters and receivers (e.g., the specific example described above would provide the connector 316 connected to 8 transmitter differential trace pairs (e.g., 8 sets of positive/negative transmitter traces) and 8 receiver differential trace pairs (e.g., 8 sets of positive/negative receiver traces)), and thus the testing of any of those differential trace pairs (or differential trace pairs on other connectors) will fall within the scope of the present disclosure as well.

Figure 4A:
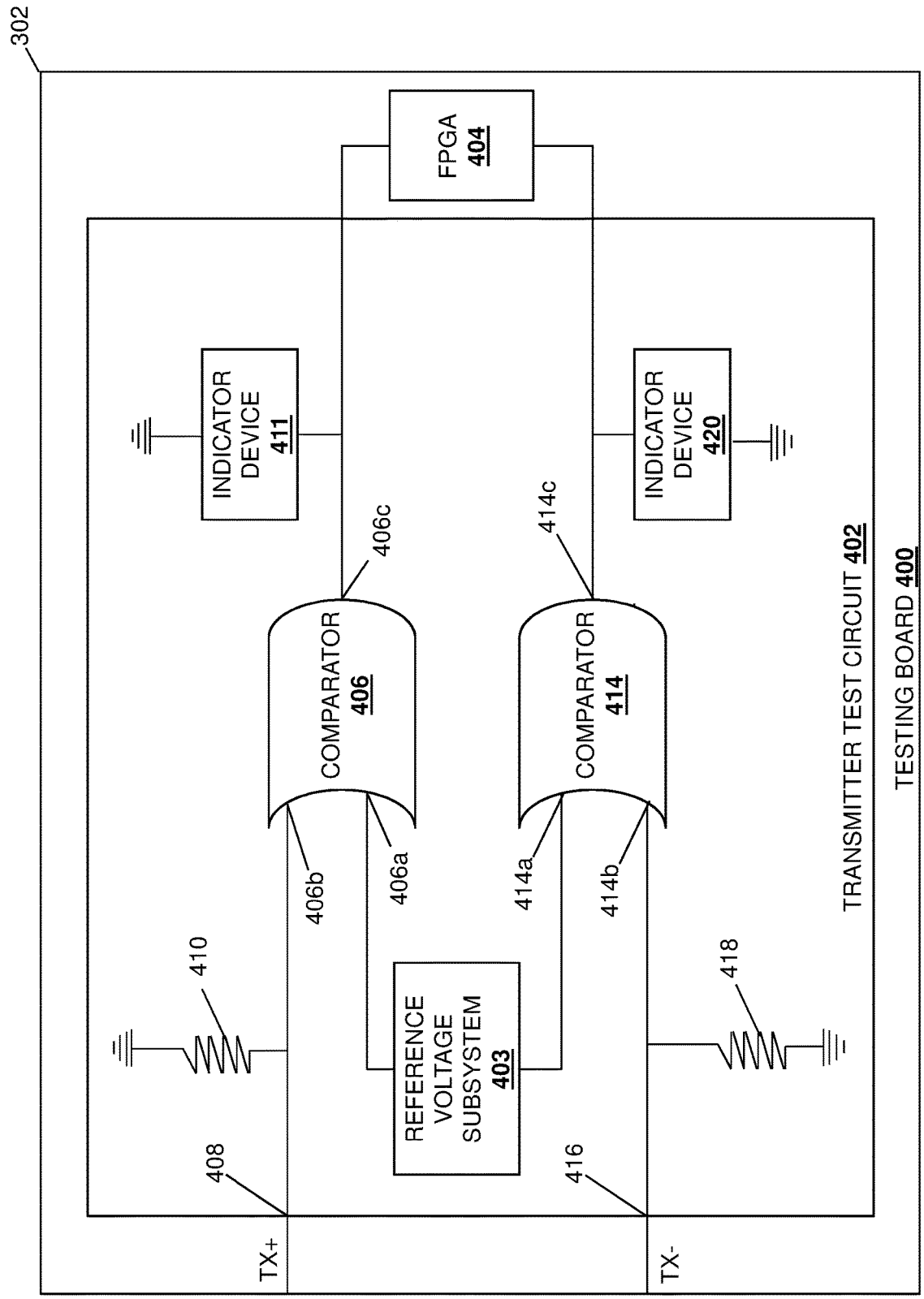
FIG. 4A is a schematic view illustrating an embodiment of a portion of a testing board that may be included in the high-speed signal subsystem testing system of FIG. 2.

Referring now to FIG. 4A, an embodiment of a testing board 400 is illustrated that may provide a portion of the testing board 212 discussed above with reference to FIG. 2. In the illustrated example, the testing board 400 includes a transmitter test circuit 402 that may provide one of (or a portion of one of) the test circuit(s) 216a-216f discussed above with reference to FIG. 2. In the illustrated example, the transmitter test circuit 402 includes a reference voltage subsystem 403, and the testing board 400 include an FPGA 404 that may provide the FPGA 214 discussed above with reference to FIG. 2. The transmitter test circuit 402 also includes a comparator 406 having a comparator input 406a coupled to the reference voltage subsystem 403, and a comparator input 406b coupled to a positive transmitter (TX+) input 408, with the coupling to the positive transmitter input 408 including a resistor 410 (e.g., a 1000 ohm resistor in the specific examples provided below) that is coupled to ground. As described below, the positive transmitter input 408 may be coupled via any of the cable 218a-218f/connector 220a-220f combinations to the positive transmitter pin on any of the connectors 206a-206f/300 (e.g., the positive transmitter pin 320a in FIG. 3). The comparator 406 also includes a comparator output 406c coupled to the FPGA 404. As discussed below, in optional embodiments, the coupling between the comparator output 406c and the FPGA 404 may include an indicator device 411 (e.g., including a Light Emitting Device (LED), an LED controller, and/or any other indicator components that one of skill in the art in possession of the present disclosure would recognize as providing the indicator functionality discussed below) that is coupled to ground.

The transmitter test circuit 402 also includes a comparator 414 having a comparator input 414a coupled to the reference voltage subsystem 403, and a comparator input 414b coupled to a negative transmitter (TX-) input 416, with the coupling to the negative transmitter input 416 including a resistor 418 (e.g., a 1000 ohm resistor in the specific examples provided below) that is coupled to ground. As described below, the negative transmitter input 416 may be coupled via any of the cable 218a-218f/connector 220a-220f combinations to the negative transmitter pin on any of the connectors 206a-206f/300 (e.g., the negative transmitter pin 320b in FIG. 3). The comparator 414 also includes a comparator output 414c coupled to the FPGA 404. As discussed below, in optional embodiments, the coupling between the comparator output 414c and the FPGA 404 may include an indicator device 420 (e.g., an LED, an LED controller, and/or any other indicator components that one of skill in the art in possession of the present disclosure would recognize as providing the indicator functionality discussed below) that is coupled to ground.

Figure 4B:
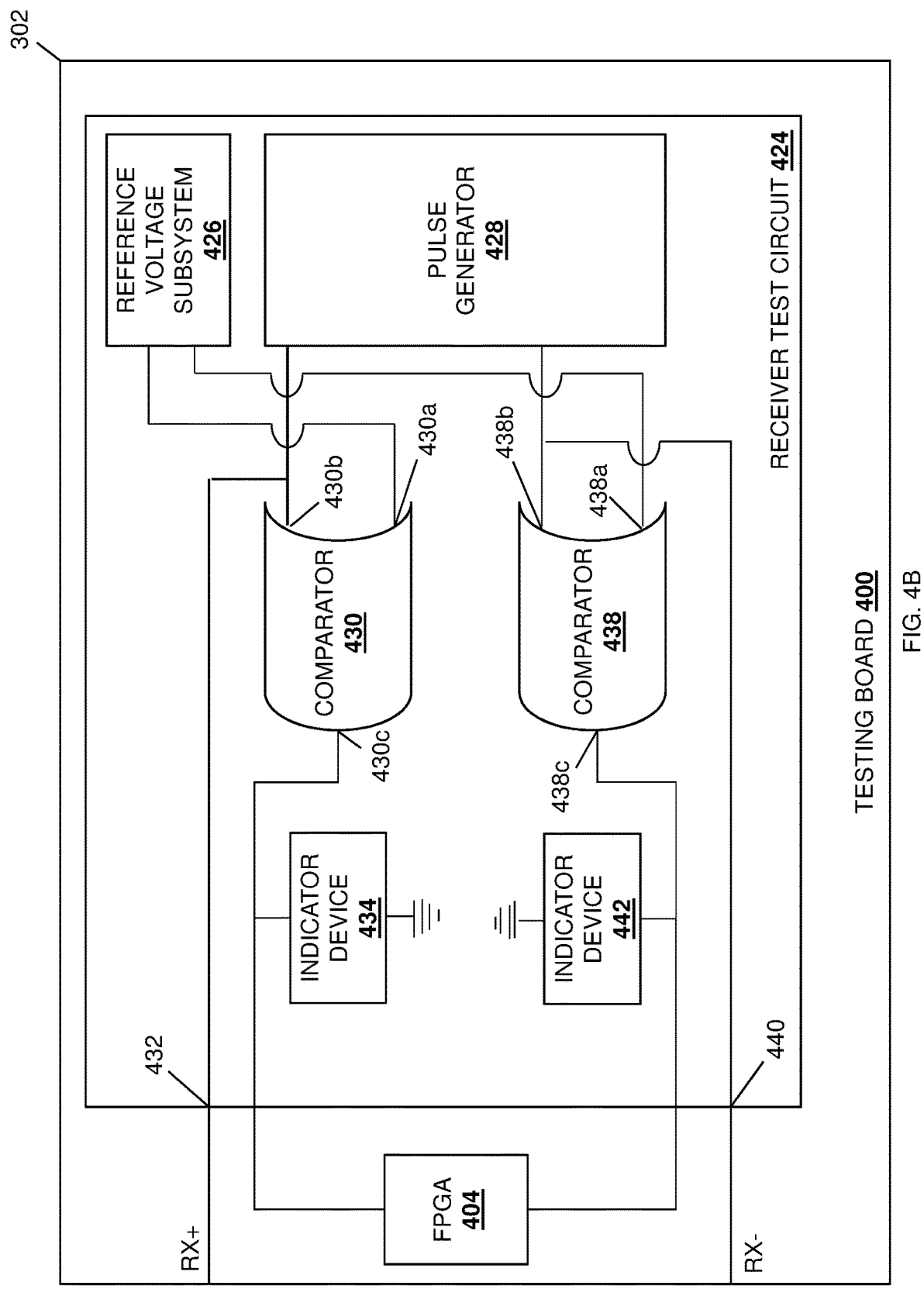
FIG. 4B is a schematic view illustrating an embodiment of a portion of the testing board of FIG. 4B.

Referring now to FIG. 4B, an embodiment of the testing board 400 is illustrated that may provide a portion of the testing board 212 discussed above with reference to FIG. 2. In the illustrated example, the testing board 400 includes a receiver test circuit 424 that may provide one of (or a portion of one of) the test circuit(s) 216a-216f discussed above with reference to FIG. 2. In the illustrated example, the receiver test circuit 424 includes a reference voltage subsystem 426 and a pulse generator 428, and the testing board 400 include the FPGA 404 that may provide the FPGA 214 discussed above with reference to FIG. 2. In the specific examples provided below, the pulse generator has a source resistance of 50 ohms, but one of skill in the art in possession of the present disclosure will appreciate how different pulse generator resistances will fall within the scope of the present disclosure as well. The receiver test circuit 424 also includes a comparator 430 having a comparator input 430a coupled to the reference voltage subsystem 426, and a comparator input 430b coupled to the pulse generator 428 and a positive receiver output/input 432. As described below, the positive receiver output/input 432 may be coupled via any of the cable 218a-218f/connector 220a-220f combinations to the positive receiver pin on any of the connectors 206a-206f/300 (e.g., the positive receiver pin 318a in FIG. 3). The comparator 430 also includes a comparator output 430c coupled to the FPGA 404. As discussed below, in optional embodiments, the coupling between the comparator output 430c and the FPGA 404 may include an indicator device 434 (e.g., an LED, an LED controller, and/or any other indicator components that one of skill in the art in possession of the present disclosure would recognize as providing the indicator functionality discussed below) that is coupled to ground.

The receiver test circuit 424 also includes a comparator 438 having a comparator input 438a coupled to the reference voltage subsystem 426, and a comparator input 438b coupled to the pulse generator 428 and a negative receiver output/input 440. As described below, the negative receiver output/input 440 may be coupled via any of the cable 218a-218f/connector 220a-220f combinations to the negative receiver pin on any of the connectors 206a-206f/300 (e.g., the negative receiver pin 318b in FIG. 3). The comparator 438 also includes a comparator output 438c coupled to the FPGA 404. As discussed below, in optional embodiments, the coupling between the comparator output 438c and the FPGA 404 may include an indicator device 442 (e.g., an LED, an LED controller, and/or any other indicator components that one of skill in the art in possession of the present disclosure would recognize as providing the indicator functionality discussed below) that is coupled to ground. However, as described above, while the testing board 400 illustrated in FIGS. 4A and 4B is used below to describe the testing of a single receiver differential trace pair associated with a receiver and a single transmitter differential trace pair associated with a transmitter, as discussed above and as will be appreciated by one of skill in the art in possession of the present disclosure, the testing board 400 may include a transmitter test circuit 402 for each transmitter differential trace pair on the circuit board 202, as well as a receiver test circuit 424 for each receiver differential trace pair on the circuit board 202. For example, using the specific example above that includes 32 connectors 206a-206f that are each connected to 8 transmitter differential trace pairs (e.g., 8 sets of positive/negative transmitter traces) and 8 receiver differential trace pairs (e.g., 8 sets of positive/negative receiver traces), each transmitter test circuit 402 coupled to a connector 206a-206f may include 16 comparators for the transmitter traces and 16 comparators for the receiver traces, resulting in 1024 comparators on the testing board 212/400 outputting to the FPGA 214/404.

Referring now to FIG. 5, an embodiment of a method 500 for testing high-speed signaling subsystem is illustrated. As discussed below, embodiments of the systems and methods of the present disclosure provide for the testing of a transmitter trace on a circuit board, the connection of that transmitter trace to transmitter in a processing system via a pad on the circuit board to which the processing system is mounted, the connection of that transmitter trace to a connector on the circuit board, and the connector, without having to assemble the circuit board as part of the device in which it will be provided. For example, the high-speed signal subsystem testing system of the present disclosure tests a processor transmitter coupled to a connector via a transmitter trace. A transmitter test circuit on a testing board coupled to the connector compares a transmitter voltage received from the transmitter via the transmitter trace and the connector to a common mode voltage range and, in response to the transmitter voltage being outside the common mode voltage range, provides a transmitter trace issue signal. As such, transmitter traces on circuit boards may be tested to determine whether any portion of the high-speed signal subsystem associated with that transmitter trace is experiencing issues that would prevent its desired operation.

Figure 6A:
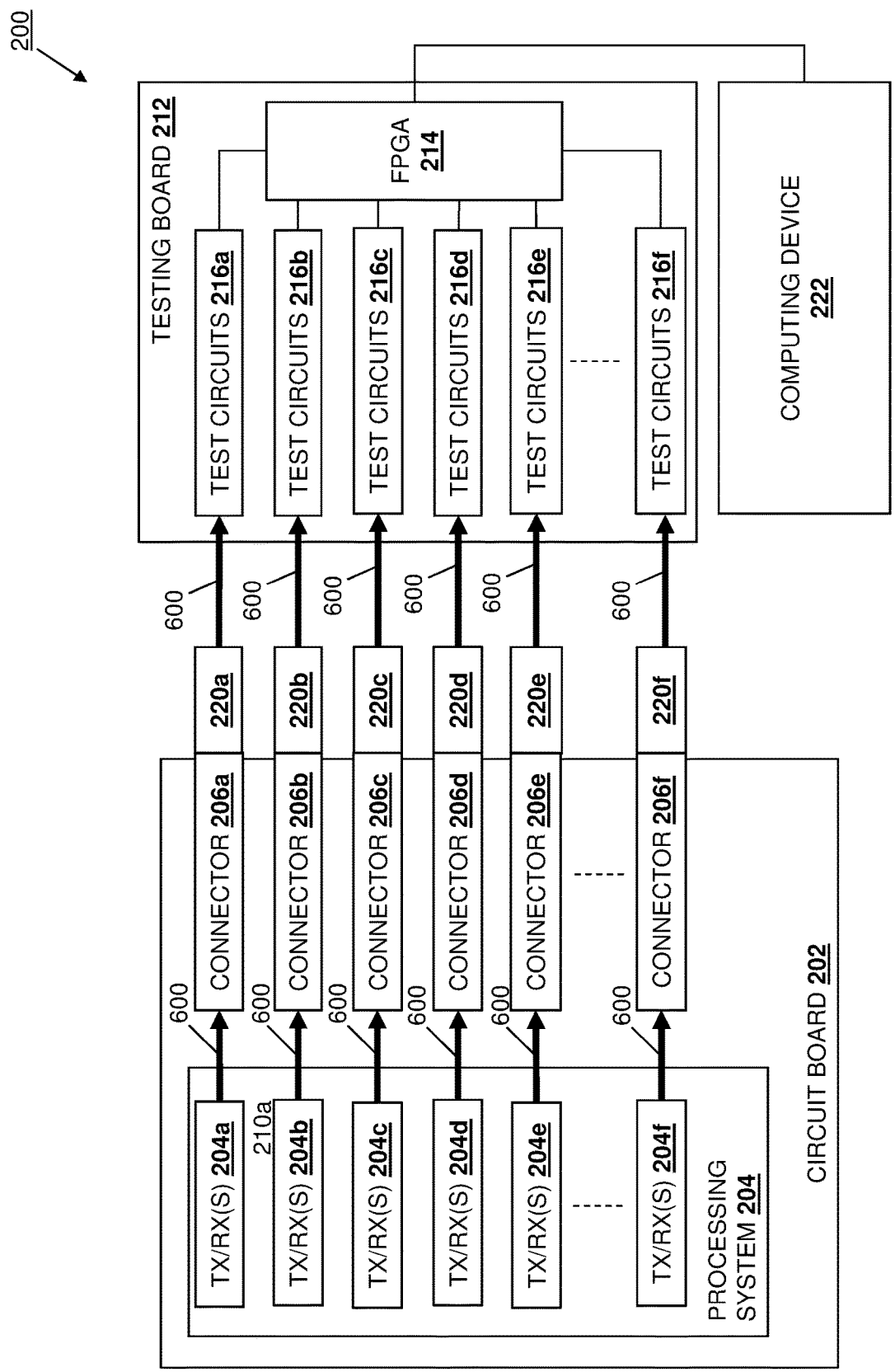
FIG. 6A is a schematic view illustrating an embodiment of the high-speed signal subsystem testing system of FIG. 2 operating during the method of FIG. 5.

The method 500 begins at block 502 where a transmitter test circuit compares a transmitter voltage received from a transmitter via a transmitter trace to a common mode voltage range. With reference to FIG. 2, prior to the method 500, the testing board 212 may be coupled to the circuit board 202 by connecting the test circuits 216a-216f to the connectors 206a-206f, respectively, via the cables 218a-218f, respectively, and connectors 220a-220f, respectively. Furthermore, while not illustrated in the Figures discussed below, one of skill in the art in possession of the present disclosure will recognize how the circuit board 202 may be powered using a variety of power subsystems that one of skill in the art in possession of the present disclosure would recognize allow for the powering of a circuit board without its installation in a device chassis or the full assembly of an associated device. With reference to FIGS. 2 and 6A, in an embodiment of block 502, each of the transmitters in the transmitter/receiver(s) 204a-204f may perform transmitter voltage transmission operations 600 that include transmitting a transmitter voltage via the BGA pads 210a-210f, respectively, the traces 208a-208f, respectively, the connectors 206a-206f, respectively, the connectors 220a-220f, respectively, and the cables 218a-218f, respectively, such that the transmitter voltages are received via the test circuits 216a-216f, respectively.

Figure 6B:
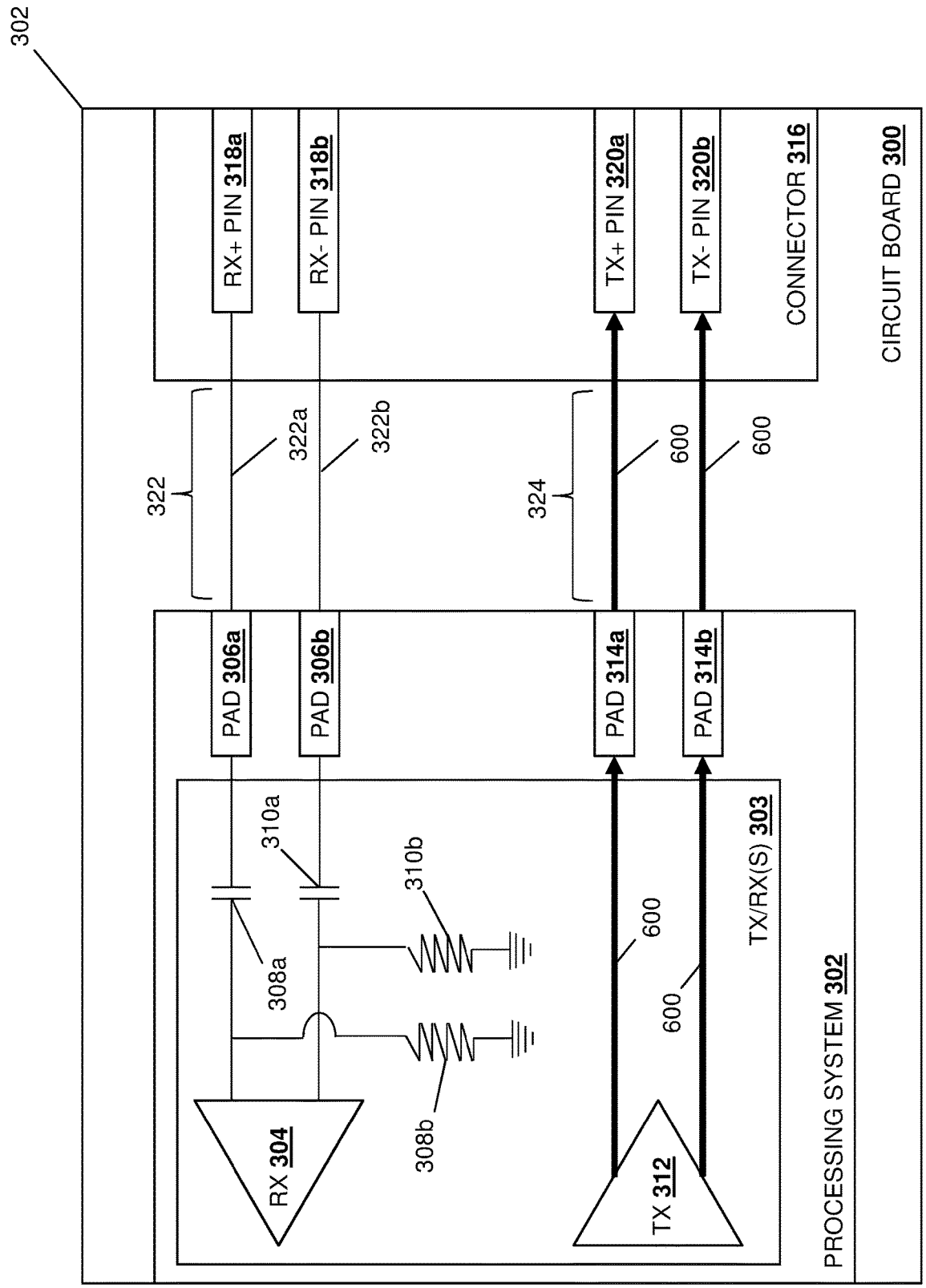
FIG. 6B is a schematic view illustrating an embodiment of the circuit board of FIG. 3 operating during the method of FIG. 5.

With reference to FIGS. 3 and 6B, a specific example of the transmission of transmitter voltages by a transmitter via a transmitter differential trace pair is illustrated. As can be seen, the transmitter 312 may operate to perform the transmitter voltage transmission operations 600 to transmit a transmitter voltage via the pad 314a and through the positive transmitter trace 324a in the transmitter differential trace pair 324 to the positive transmitter pin 320a in the connector 316, and transmit a transmitter voltage via the pad 314b and through the negative transmitter trace 324b in the transmitter differential trace pair 324 to the negative transmitter pin 320b in the connector 316. As will be appreciated by one of skill in the art in possession of the present disclosure, when power is provided to the circuit board 300 such that the processing system 302 receives power while in an "idle" mode (i.e., when the processing system is performing no operations or limited operations), the transmitter 312 may provide a Direct Current (DC) common mode voltage within a range of $V_{low}$ (i.e., the lower end of the common mode voltage) to $V_{high}$, (the higher end of the common mode voltage).

One of skill in the art in possession of the present disclosure will recognize that, during conventional signal transmission operations, signals transmitted via the positive transmitter trace 324a in the transmitter differential trace pair 324 will be provided via voltages above common mode voltage range described above, and signals transmitted via the negative transmitter trace 324b in the transmitter differential trace pair 324 will be provided via voltages below the common mode voltage range described above. As described below, embodiments of the high-speed signal subsystem testing system of the present disclosure use the common mode voltages transmitted by the transmitters via their transmitter traces to determine whether there are any issues with the high-speed signal subsystems associated with those transmitter traces. However, while the discussion below utilizes common mode voltages transmitted by transmitters to detect issues with their corresponding transmitter traces, one of skill in the art in possession of the present disclosure will appreciate that other transmitter voltages may be utilized while remaining within the scope of the present disclosure as well.

Figure 6C:
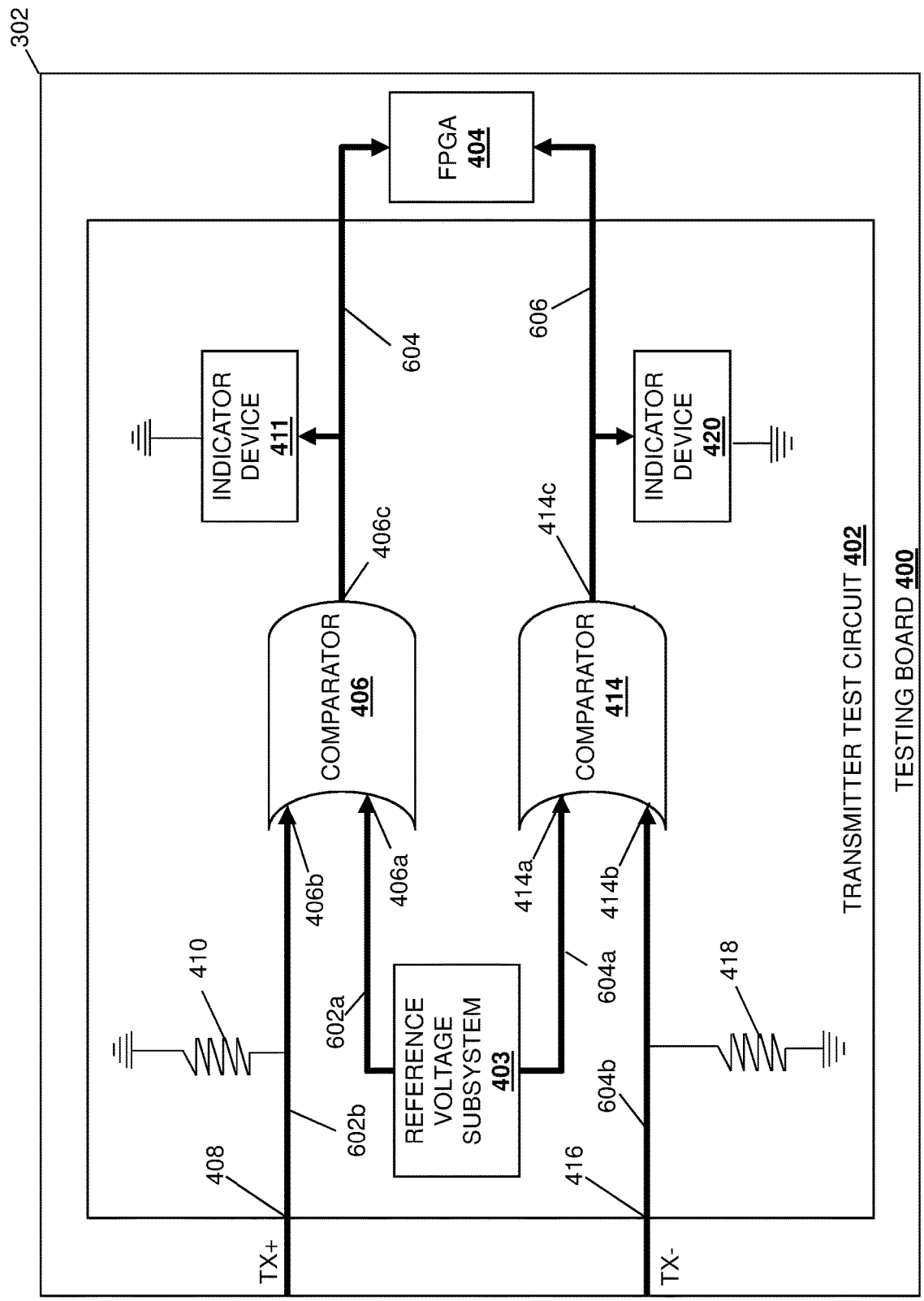
FIG. 6C is a schematic view illustrating an embodiment of the testing board of FIG. 4A operating during the method of FIG. 5.

With reference to FIGS. 2, 6A, and FIG. 6C, the transmitter voltages transmitted via the connectors 206a-206f, respectively, the connectors 220a-220f, respectively, and the cables 218a-218f, respectively, as part of the transmitter voltage transmission operations 600, may be received at the transmitter test circuit 402 on the testing board 400 (with the positive transmitter input 408 on the transmitter test circuit 402 receiving the transmitter voltage transmitted via the positive transmitter pin 320a in the connector 316 in the circuit board 300, and with the negative transmitter input 416 on the transmitter test circuit 402 receiving the transmitter voltage transmitted via the negative transmitter pin 320b in the connector 316 in the circuit board 300). With reference to FIG. 6C, the comparator 406 may perform reference voltage receiving operations 602a to receive a reference voltage at the comparator input 406a from the reference voltage subsystem 403, perform transmitter voltage receiving operations 602b to receive the transmitter voltage at the comparator input 406b via the positive transmitter input 408, and perform transmitter voltage/reference voltage comparison operations to compare that that transmitter voltage to that reference voltage. Similarly, the comparator 414 may perform reference voltage receiving operations 604a to receive the reference voltage at the comparator input 414a from the reference voltage subsystem 403, perform transmitter voltage receiving operations 604b to receive the transmitter voltage at the comparator input 414b via the negative transmitter input 416, and perform transmitter voltage/reference voltage comparison operations to compare that that transmitter voltage to that reference voltage.

The method 500 then proceeds to decision block 504 where it is determined whether the transmitter voltage is outside the common mode voltage range. With continued reference to FIG. 6C, in an embodiment of decision block 504, the transmitter voltage/reference voltage comparison operations performed by the comparator 406 will compare the transmitter voltage received at the comparator input 406b via the positive transmitter input 408 to the reference voltage received at the comparator input 406a from the reference voltage subsystem 403, and determine whether that transmitter voltage is below that reference voltage. Similarly, in an embodiment of decision block 504, the transmitter voltage/reference voltage comparison operations performed by the comparator 414 will compare the transmitter voltage received at the comparator input 414b via the negative transmitter input 416 to the reference voltage received at the comparator input 414a from the reference voltage subsystem 403, and determine whether that transmitter voltage is below that reference voltage.

Continuing with the specific examples discussed above that utilize the common mode voltage transmitted by transmitters, the reference voltage provided by the reference voltage subsystem 403 may be some voltage level lower than the lower range of the common mode voltage (e.g., $V_{low}$–0.2V, which one of skill in the art in possession of the present disclosure will recognize ensures that relatively small dips (e.g., less than 0.2V) below the lower end of the common mode voltage range are not interpreted as "outside" the common mode voltage range)). As described herein, any issue with the high-speed signal subsystem associated with a transmitter trace will prevent the voltage level transmitted by its corresponding transmitter from reaching the comparator, and thus one of skill in the art in possession of the present disclosure will recognize how the reference voltage may be selected to ensure issues with the high-speed signal subsystem associated with a transmitter trace are accurately identified. For example, when the reference voltage is ($V_{low}$–0.2V) and in situations where there are no issues with the high-speed signal subsystem associated with a corresponding transmitter trace, the input to the comparators 406/414 will be higher than the reference voltage range (i.e., that input will be in the common mode voltage range between $V_{low}$ and $V_{high}$), and the output of that comparator will be high to indicate that there are no issues with the high-speed signal subsystem associated with that corresponding transmitter trace. Similarly, when the reference voltage is ($V_{low}$–0.2V) and in situations where there are issues with the high-speed signal subsystem associated with a corresponding transmitter trace, the input to the comparators 406/414 will be lower than the reference voltage range (i.e., that input will be ground due to the resistors 410/418), and the output of that comparator will be low to indicate that there are issues with the high-speed signal subsystem associated with that corresponding transmitter trace.

If, at decision block 504, it is determined that the transmitter voltage is not outside the common mode voltage range, the method 500 proceeds to block 506 where the transmitter test circuit indicates no issue with the transmitter trace. In an embodiment and as discussed above, at block 506 and in response to the transmitter voltage received at the comparator input 406b via the positive transmitter input 408 being within the common mode voltage range, the comparator 406 may output a high signal at the comparator output 406c to indicate that there are no issues with the high-speed signal subsystem associated with a corresponding transmitter trace. As will be appreciated by one of skill in the art in possession of the present disclosure, in optional embodiments that include the indicator device 411, the high signal transmitted to the FPGA 404 via the comparator output 406c may be received by the indicator device 411, which may be configured to not illuminate in response to a high signal from the comparator 406.

In an embodiment and as discussed above, at block 506 and in response to the transmitter voltage received at the comparator input 414b via the negative transmitter input 416 being within the common mode voltage range, the comparator 414 may output a high signal at the comparator output 414c to indicate that there are no issues with the high-speed signal subsystem associated with a corresponding transmitter trace. As will be appreciated by one of skill in the art in possession of the present disclosure, in optional embodiments that include the indicator device 420, the high signal transmitted to the FPGA 404 via the comparator output 414c may be received by the indicator device 420, which may be configured to not illuminate in response to a high signal from the comparator 414. As such, the transmitter test circuit 402 may be configured to test transmitter traces in a transmitter differential trace pair and, in the event the transmitter voltage received via a transmitter trace is within the common mode voltage range discussed above, the transmitter test circuit may indicate no issue with that transmitter trace.

If at decision block 504, it is determined that the transmitter voltage is outside the common mode voltage range, the method 500 proceeds to block 508 where the transmitter test circuit provides a transmitter trace issue signal. In an embodiment and as discussed above, at block 508 and in response to the transmitter voltage received at the comparator input 406b via the positive transmitter input 408 being outside the common mode voltage range, the comparator 406 may perform transmitter trace issue signal transmission operations 604 that may include generating and transmitting a transmitter trace issue signal (e.g., the low signal discussed above that indicate that there are issues with the high-speed signal subsystem associated with a corresponding transmitter trace) to the FPGA 404 via the comparator output 406c. As will be appreciated by one of skill in the art in possession of the present disclosure, in optional embodiments that include the indicator device 411, the transmitter trace issue signal/low signal transmitted to the FPGA 404 via the comparator output 406c may be received by the indicator device 411, which may be configured to illuminate in response to a transmitter trace issue signal/low signal from the comparator 406.

In an embodiment and as discussed above, at block 508 and in response to the transmitter voltage received at the comparator input 414*b* via the negative transmitter input 416 being outside the common mode voltage range, the comparator 414 may perform transmitter trace issue signal transmission operations 606 that may include generating and transmitting a transmitter trace issue signal (e.g., the low signal discussed above that indicate that there are issues with the high-speed signal subsystem associated with a corresponding transmitter trace) to the FPGA 404 via the comparator output 414*c*. As will be appreciated by one of skill in the art in possession of the present disclosure, in optional embodiments that include the indicator device 420, the transmitter trace issue signal/low signal transmitted to the FPGA 404 via the comparator output 414*c* may be received by the indicator device 420, which may be configured to illuminate in response to a transmitter trace issue signal/low signal from the comparator 414. As such, the transmitter test circuit 402 may be configured to test transmitter traces in a transmitter differential trace pair and, in the event the transmitter voltage received via a transmitter trace is outside the common mode voltage range, the transmitter test circuit may indicate an issue with that transmitter trace by outputting a transmitter trace issue signal/low signal.

Figure 6D:
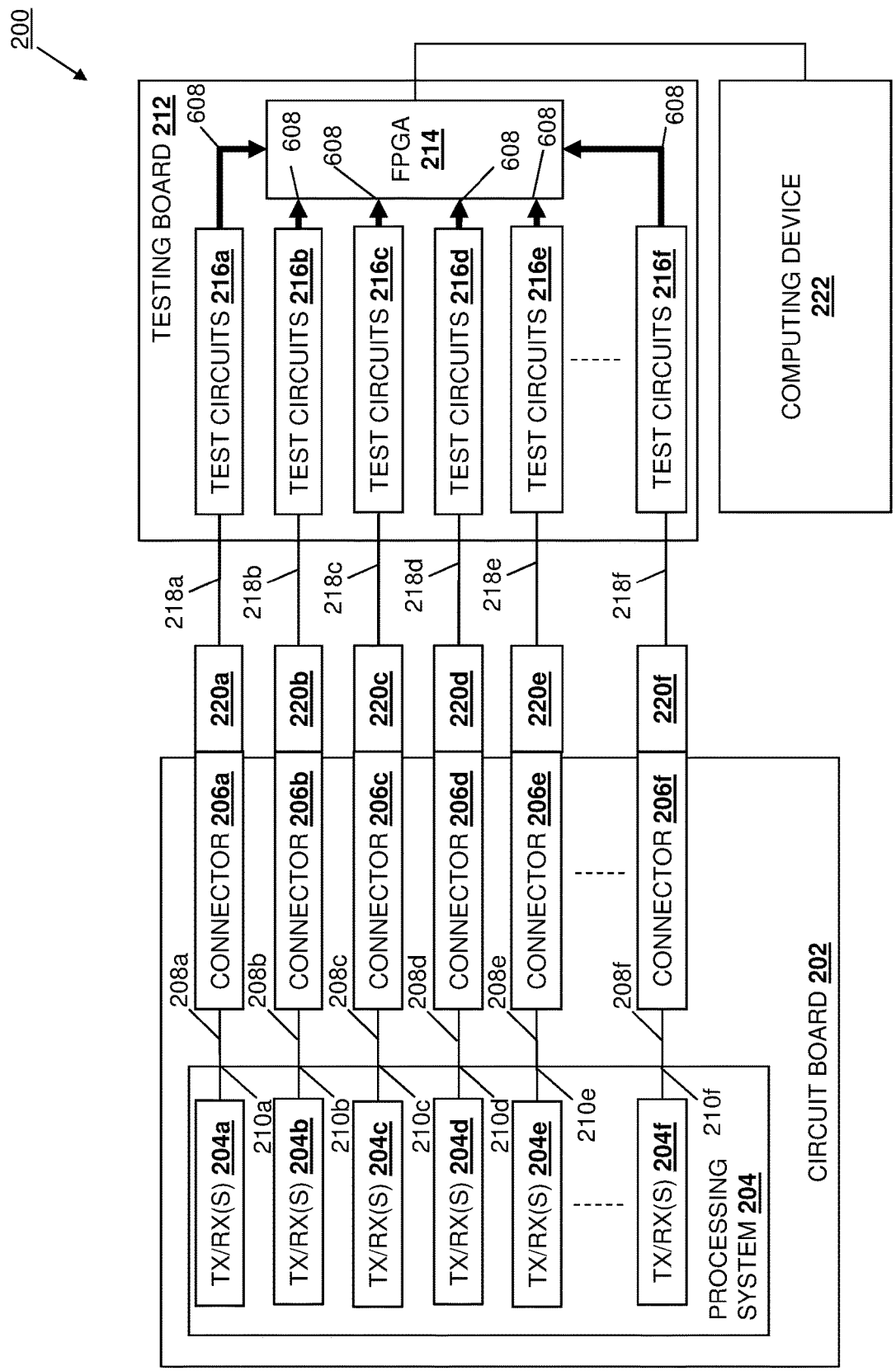
FIG. 6D is a schematic view illustrating an embodiment of the high-speed signal subsystem testing system of FIG. 2 operating during the method of FIG. 5.
Figure 6E:
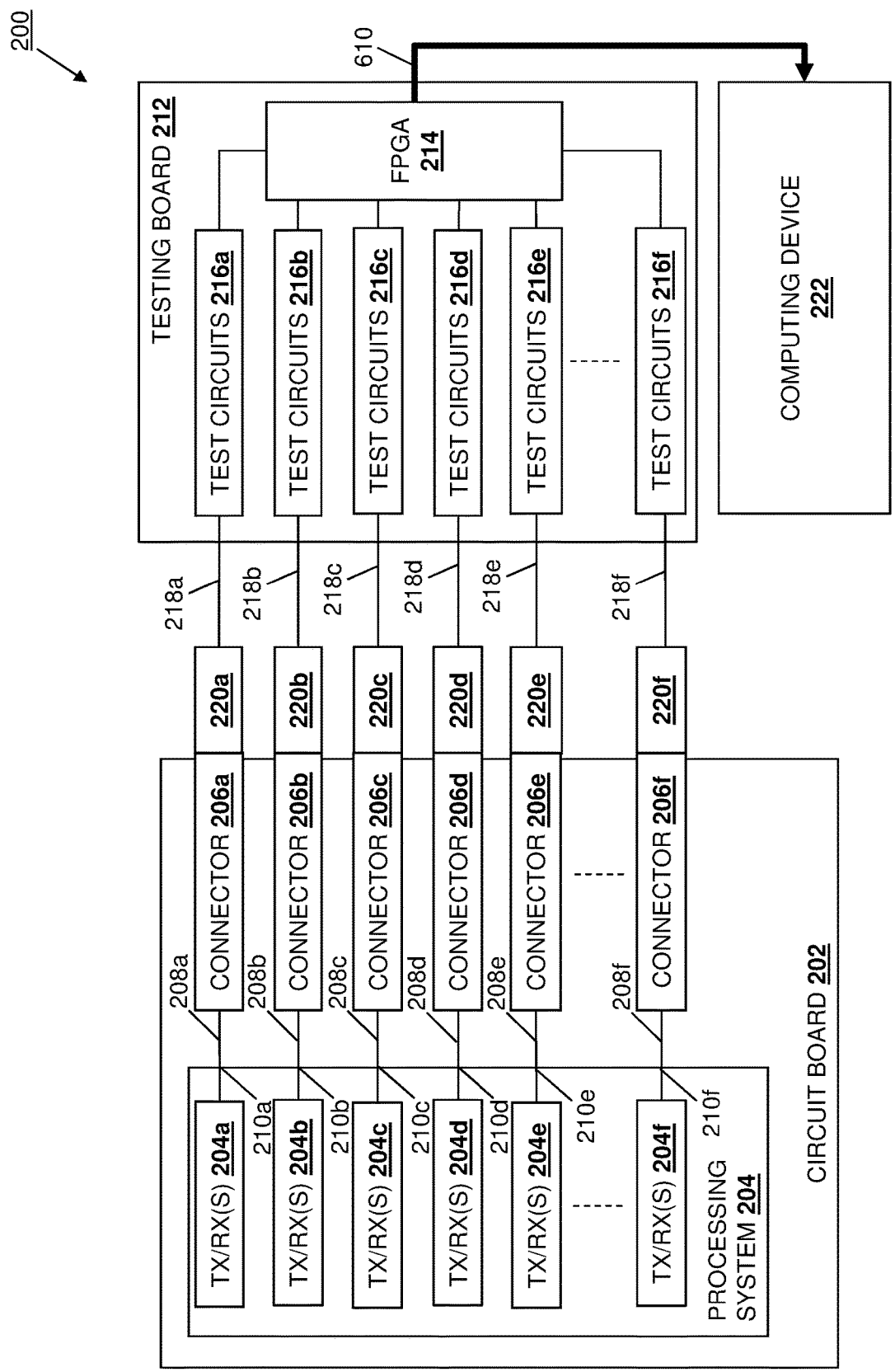
FIG. 6E is a schematic view illustrating an embodiment of the high-speed signal subsystem testing system of FIG. 2 operating during the method of FIG. 5.

As such, as illustrated in FIG. 6D, any of the test circuits 216*a*-216*f* that determine that a transmitter voltage received from a transmitter is outside a common mode voltage range may perform transmitter trace issue signal transmission operations 608 to transmit a corresponding transmission trace issue signal associated with the high-speed signal subsystem for the corresponding transmitter trace, thus allowing the FPGA to receive a transmission trace issue signal for any transmitter traces with high-speed signal subsystems that are experiencing issues. With reference to FIG. 6E, the FPGA 214 may receive trace issue signal(s) from the transmitter test circuit(s) 216*a*-216*f* and, in response, may perform trace issue signal information generation/transmission operations 610 to generate and transmit trace issue signal information to the computing device 222. For example, the trace issue signal information may consolidate the trace issue signal(s) received from the transmitter test circuit(s) 216*a*-216*f*, and the computing device 222 may be configured to provide that trace issue signal information for display on a display device (e.g., the display 110 discussed above with reference to FIG. 1). As will be appreciated by one of skill in the art in possession of the present disclosure, the number of traces being tested (e.g., 1024 transmitter and receiver traces in the specific example described above) may complicate the provisioning of indicator devices for each of those traces, and thus the transmission of the trace issue signal information to the computing device 222 may provide particular benefits when testing circuit boards with relatively large numbers of traces.

Figure 7:
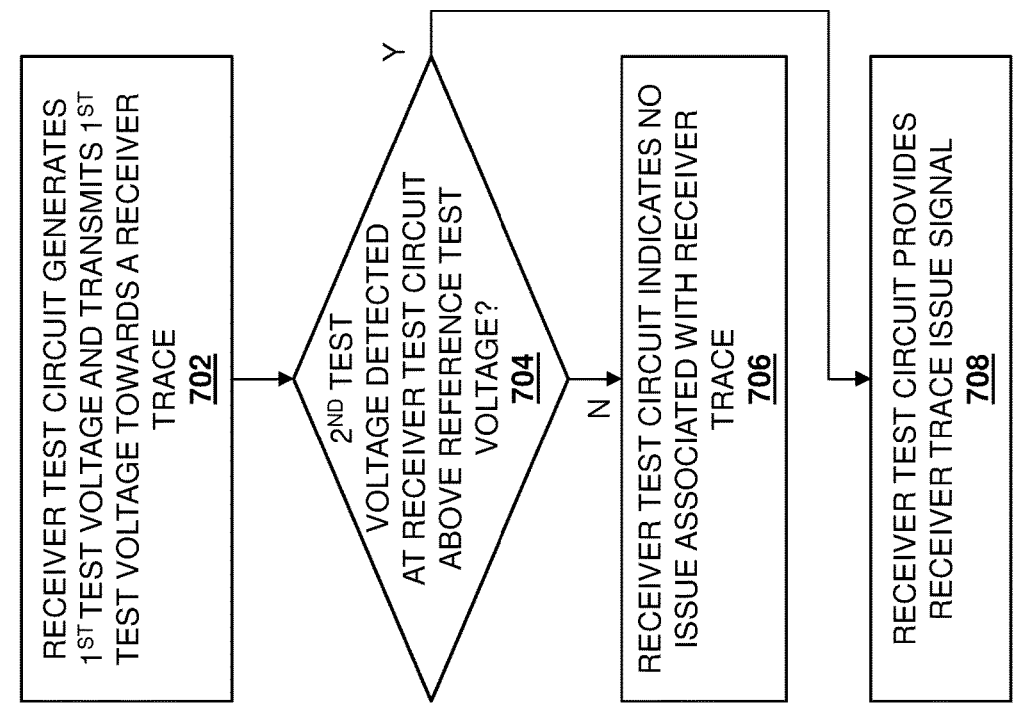
FIG. 7 is a flow chart illustrating an embodiment of a method for testing high-speed signaling subsystems.

Referring now to FIG. 7, an embodiment of a method 500 for testing high-speed signaling subsystem is illustrated. As discussed below, the systems and methods of the present disclosure provide for the testing of a receiver trace on a circuit board, the connection of that receiver trace to a receiver in a processing system via a pad on the circuit board to which the processing system is mounted, the connection of that receiver trace to a connector on the circuit board, and the connector, without having to assemble the circuit board as part of the device in which it will be provided. For example, the high-speed signal subsystem testing system of the present disclosure tests a processor receiver coupled to a connector via a receiver trace. A receiver test circuit on a testing board coupled to the connector provides a first test voltage to the receiver, compares a second test voltage detected at the receiver test circuit in response to providing the first test voltage to the receiver and, in response to the second voltage being above a reference test voltage, provides a receiver trace issue signal. As such receiver traces on circuit boards may be tested to determine whether any portion of the high-speed signal subsystem associated with that receiver trace is experiencing issues that would prevent its desired operation.

The method 700 begins at block 702 where a receiver test circuit generates a test voltage and transmits the test voltage towards a receiver trace. With reference to FIG. 2, prior to the method 500, the testing board 212 may be coupled to the circuit board 202 by connecting the test circuits 216*a*-216*f* to the connectors 206*a*-206*f*, respectively, via the cables 218*a*-218*f*, respectively, and connectors 220*a*-220*f*, respectively. Furthermore, while not illustrated in the Figures discussed below, one of skill in the art in possession of the present disclosure will recognize how the circuit board 202 may be powered using a variety of power subsystems that one of skill in the art in possession of the present disclosure would recognize allow for the powering of a circuit board without its installation in a device chassis or the full assembly of an associated device.

Figure 8A:
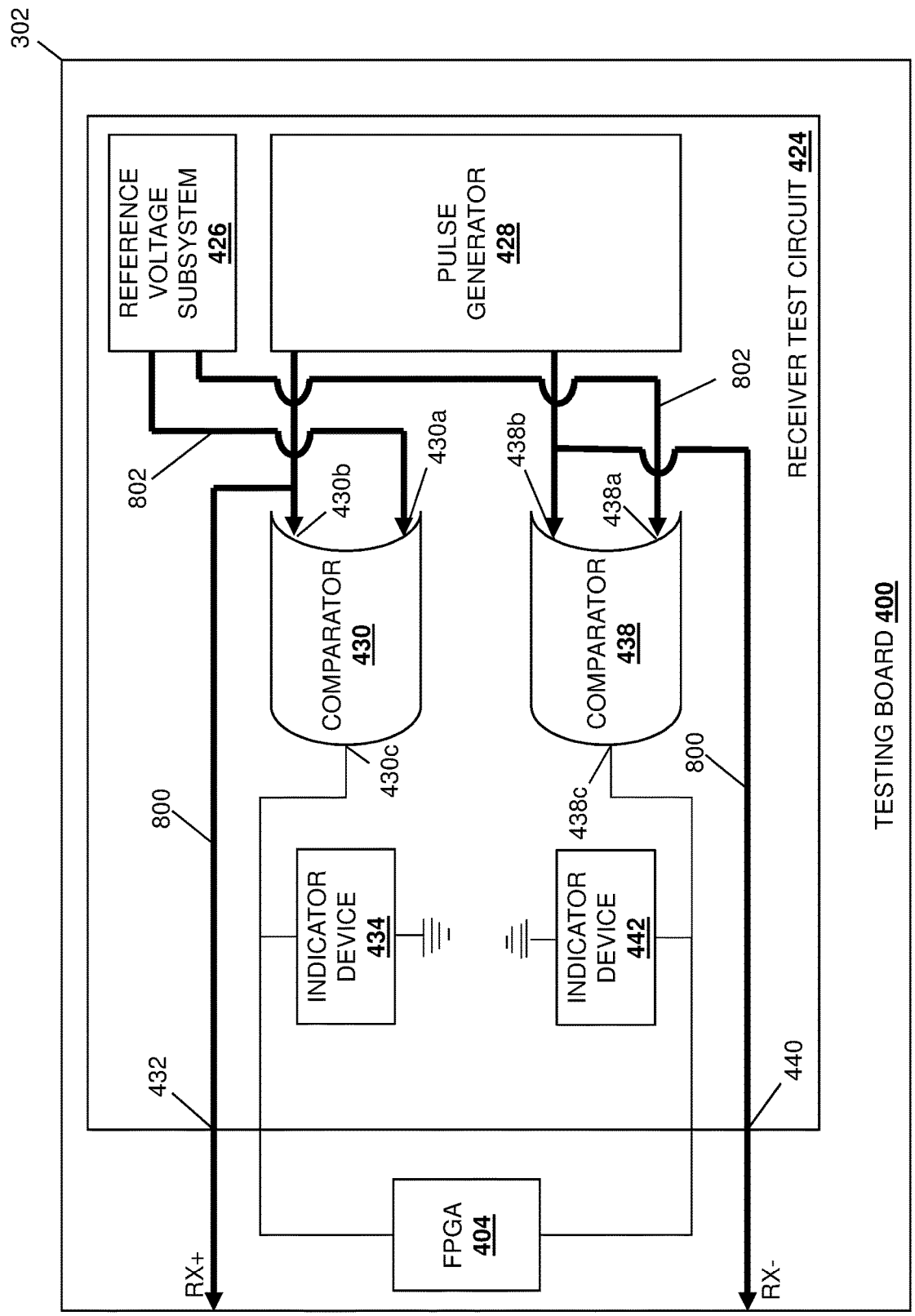
FIG. 8A is a schematic view illustrating an embodiment of the testing board of FIG. 4B operating during the method of FIG. 5.
Figure 8B:
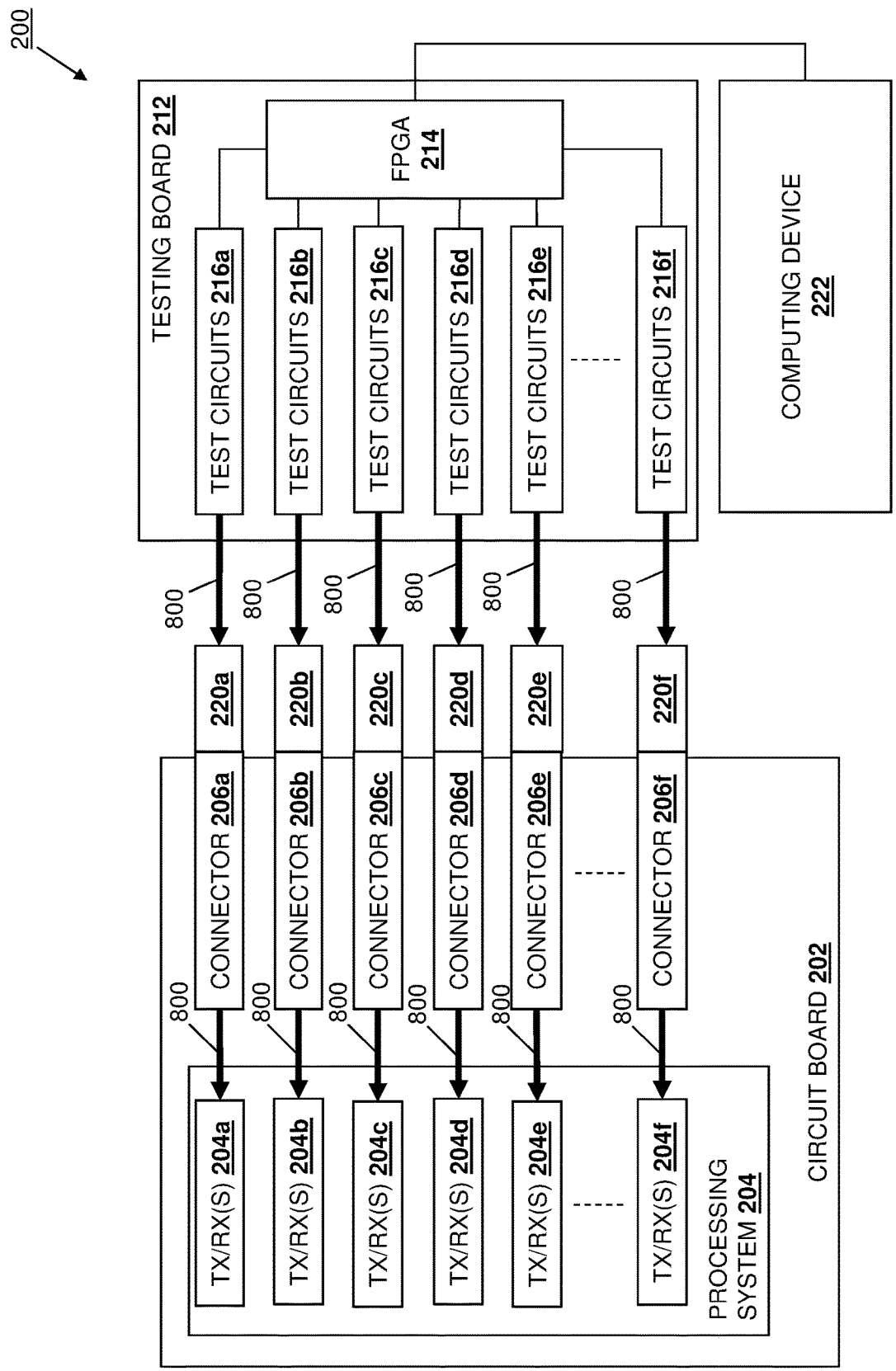
FIG. 8B is a schematic view illustrating an embodiment of the high-speed signal subsystem testing system of FIG. 2 operating during the method of FIG. 5.
Figure 8C:
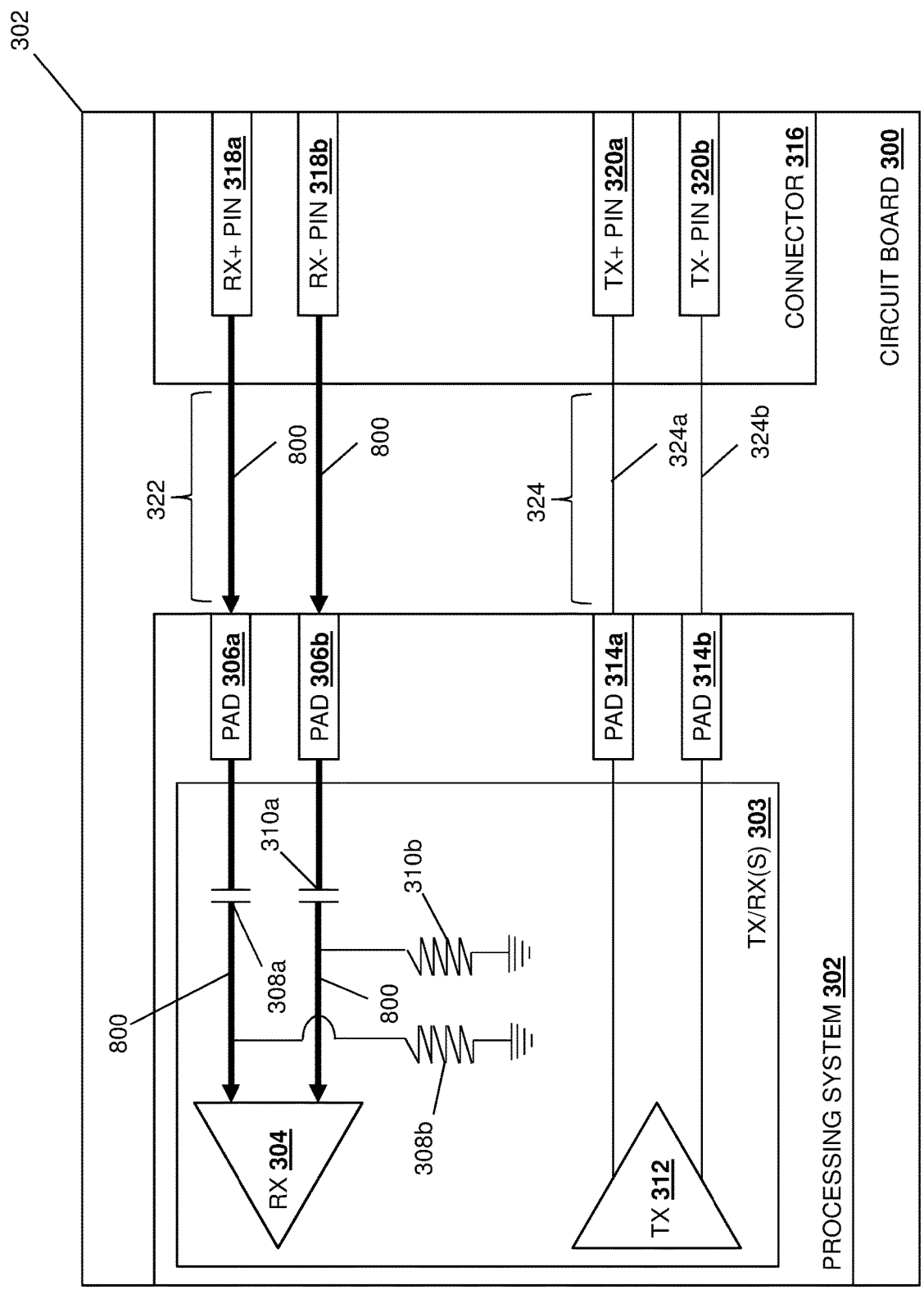
FIG. 8C is a schematic view illustrating an embodiment of the circuit board of FIG. 3 operating during the method of FIG. 5.

With reference to FIGS. 2 and 8B, in an embodiment of block 502, each of the test circuits 216*a*-216*f* may perform first test voltage transmission operations 800 that include transmitting a first test voltage towards the cables 218*a*-218*f*, respectively, the connectors 220*a*-220*f*, respectively, the connectors 206*a*-206*f*, respectively, the traces 208*a*-208*f*, respectively, the BGA pads 210*a*-210*f*, respectively, and the receivers in the transmitter/receiver(s) 204*a*-204*f*. In an embodiment, the first test voltages transmitted by the test circuits 216*a*-216*f* as part of the first test voltage transmission operations 800 may be test voltage pulses. For example, with reference to FIG. 8A, the pulse generator 428 in the receiver test circuit 424 on the testing board 400 may perform the first test voltage transmission operations 800 by generating and transmitting a first test voltage pulse towards the positive receiver output/input 432 and towards the negative receiver output/input 440. With reference to FIG. 8C, the test voltage pulse transmitted towards the positive receiver output/input 432 may be received at the positive receiver pin 318*a* in the connector 316 on the circuit board 300 (e.g., via the corresponding cable 218*a*-218*f* and connector 220*a*-220*f*), transmitted via the positive receiver trace 322*a* in the receiver differential trace pair 322, the pad 306*a*, and to the receiver 304 (i.e., in the event there are no issues with that high-speed signaling subsystem). Similarly, the first test voltage pulse transmitted towards the negative receiver output/input 440 may be received at the negative receiver pin 318*b* in the connector 316 on the circuit board 300 (e.g., via the corresponding cable 218*a*-218*f* and connector 220*a*-220*f*), transmitted via the negative receiver trace 322*b* in the receiver differential trace pair 322, the pad 306*b*, and to the receiver 304 (i.e., in the event there are no issues with that high-speed signaling subsystem).

As discussed in further detail below, the source resistance of the pulse generator 428, the resistance of the positive receiver trace 322*a* or the negative receiver trace 322*b*, and resistance of the resistor 308*b* in the coupling between the receiver 304 to the pad 306*a* or the resistor 310*b* in the coupling between the receiver 304 to the pad 306*b*, will reduce the voltage level of the a second test voltage pulse that is detected at the comparator input 430b of the comparator 430 or the comparator input 438b of the comparator 438 as compared to the first test voltage pulse generated transmitted by the pulse generator 428 towards the positive receiver trace 322a or the negative receiver trace 322b, respectively. As discussed below, knowledge of the resistances of the pulse generator 428, the positive receiver trace 322a or the negative receiver trace 322b, and the resistor 308b or 310b (e.g., 50 ohms each in the specific examples provided herein) allows for the calculation of the test voltage reduction that should be seen at the comparator inputs 430b or 438b if the high-speed signal subsystem associated with the corresponding receiver trace is not experiencing any issues.

The method 700 then proceeds to decision block 704 where it is determined whether a second test voltage detected at the receiver test circuit is above a reference test voltage. With reference to FIG. 8A, in an embodiment of decision block 704, the first test voltage transmitted towards the positive receiver output/input 432 in the receiver test circuit 424 will be detected as a second test voltage at the comparator input 430b of the comparator 430, while the reference voltage subsystem 426 will perform reference voltage transmission operations 802 to transmit a reference test voltage to the comparator input 430a of the comparator 430, and the comparator 430 will operate to perform second test voltage/reference test voltage comparison operations to determine whether the second test voltage detected at the comparator input 430b is above the reference test voltage at the comparator input 430a. Similarly, in an embodiment of decision block 704, the first test voltage transmitted towards the negative receiver output/input 440 in the receiver test circuit 424 will be detected as a second test voltage at the comparator input 438b of the comparator 438, while the reference voltage subsystem 426 will perform the reference voltage transmission operations 802 to transmit the reference test voltage to the comparator input 438a of the comparator 438, and the comparator 438 will operate to perform second test voltage/reference test voltage comparison operations to determine whether the second test voltage detected at the comparator input 438b is above the reference test voltage at the comparator input 438a.

In a specific example, the first test voltage pulse transmitted by the pulse generator 428 may have a voltage peak ($V_{peak}$) while resistance of the pulse generator 428, the positive receiver trace 322a or the negative receiver trace 322b, and the resistor 308b or the resistor 310b may be configured (e.g., with values of 50 Ohms each in the example herein) to halve the voltage peak (½ $V_{peak}$) provided by the second test voltage pulse that is detected at the receiver test circuit 424 (i.e., at the comparator inputs 430b and 438b of the comparators 430, and 438, respectively) in situations where there are no issues with the high-speed signaling subsystem associated with that receiver trace. As such, the reference test voltage provided by the reference voltage subsystem 426 may be a Direct Current (DC) voltage that is a voltage level lower than the voltage peak (e.g., $V_{peak}$–0.2V) that is provided by the first test voltage pulse (e.g., 0V to 3.3V) generated by the pulse generator 428. As described herein, any issue with the high-speed signal subsystem associated with a receiver trace will allow approximately the full voltage level of the second test voltage pulse detected at the comparator, while high-speed signal subsystem associated with a receiver trace that are not experiencing issues will reduce the voltage level of the second test voltage pulse detected at the comparator by half, and thus one of skill in the art in possession of the present disclosure will recognize how the reference test voltage may be selected to ensure issues with the high-speed signal subsystem associated with a receiver trace are identified.

For example, when the reference test voltage is ($V_{peak}$–0.2V) and in situations where there are no issues with the high-speed signal subsystem associated with corresponding a receiver trace, the 50 ohms resistances of the pulse generator 428, the positive receiver trace 322a or the negative receiver trace 322b, and the resistor 308b or the resistor 310b (e.g., a 50 ohm source driving a 50 ohm load provided by a 50 ohm trace terminated by a 50 ohm resistor) will reduce the amplitude of the first test voltage pulse $V_{peak}$ generated by the pulse generator 428 to a second test voltage pulse detected at the comparator input 430b of the comparator 430 or the comparator input 438b of the comparator 438 that includes an amplitude of ½ $V_{peak}$, and the reference voltage ($V_{peak}$–0.2V) provided to the comparator input 430a of the comparator 430 or the comparator input 438a of the comparator 438 will cause the output of that comparator to be a low pulse. Similarly, when the reference test voltage is ($V_{peak}$–0.2V) and in situations where there are issues with the high-speed signal subsystem associated with corresponding a receiver trace, the pulse generator 428 will output to a broken circuit (e.g., a 50 ohm source driving an open circuit rather than a 50 ohm load) and the second test voltage pulse detected at the comparator input 430b of the comparator 430 or the comparator input 438b of the comparator 438 will have an amplitude equal the amplitude of the first test voltage pulse $V_{peak}$ generated by the pulse generator 428, and the reference voltage ($V_{peak}$–0.2V) provided to the comparator input 430a of the comparator 430 or the comparator input 438a of the comparator 438 will cause the output of that comparator to be a high pulse.

If, at decision block 704, it is determined that the second test voltage detected at the receiver test circuit is not above the reference test voltage, the method 700 proceeds to block 706 where the receiver test circuit indicates no issue with the receiver trace. In an embodiment, at block 706 and in response to the comparator 430 determining that the second test voltage pulse detected at the comparator input 430b has an amplitude that is not above the reference test voltage received from the reference voltage subsystem 426 at the comparator input 430a, the comparator 430 may output a low pulse at the comparator output 430c. As will be appreciated by one of skill in the art in possession of the present disclosure, in optional embodiments that include the indicator device 434, the low pulse transmitted via the comparator output 430c may be received by the indicator device 434, which may be configured to not illuminate in response to a low pulse from the comparator 430.

In an embodiment, at block 706 and in response to the comparator 438 determining that the second test voltage detected at the comparator input 438b is not above the reference test voltage received from the reference voltage subsystem 426 at the comparator input 438a, the comparator 438 may output a low pulse at the comparator output 438c. As will be appreciated by one of skill in the art in possession of the present disclosure, in optional embodiments that include the indicator device 442, the low pulse transmitted via the comparator output 438c may be received by the indicator device 442, which may be configured to not illuminate in response to a low pulse from the comparator 438. As such, the receiver test circuit 424 may be configured to test receiver traces in a receiver differential trace pair and, in the event the second test voltage detected at the receiver test circuit 424 is not above the reference test voltage, the receiver test circuit may indicate no issue with that receiver trace by outputting a low pulse.

Figure 8D:
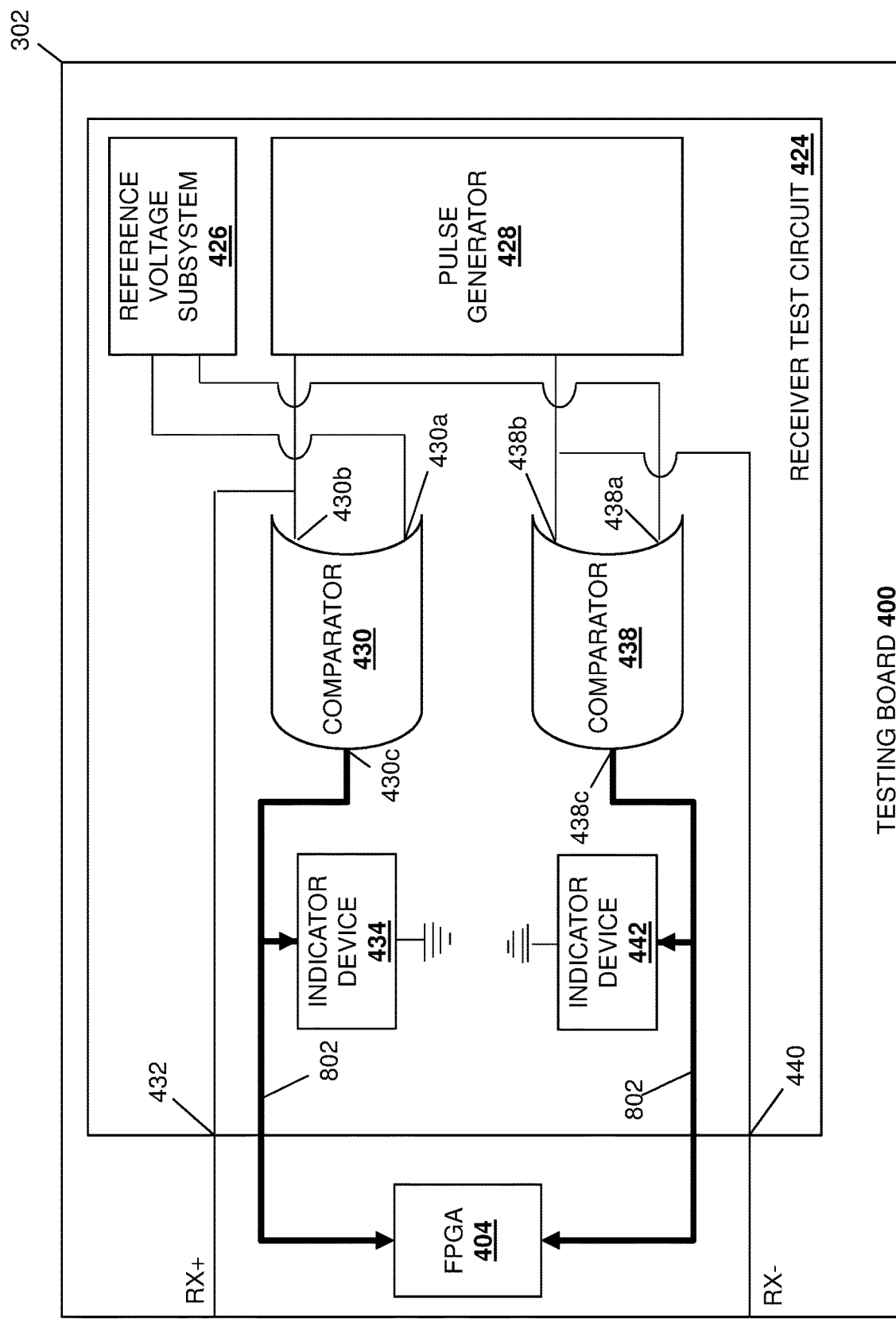
FIG. 8D is a schematic view illustrating an embodiment of the testing board of FIG. 4B operating during the method of FIG. 5.

If at decision block 704, it is determined that the second test voltage detected at the receiver test circuit is above the reference test voltage, the method 700 proceeds to block 708 where the receiver test circuit provides a receiver trace issue signal. With reference to FIG. 8D, in an embodiment of block 708 and in response to the comparator 430 determining that the second test voltage detected at the comparator input 430*b* is above the reference test voltage received from the reference voltage subsystem 426 at the comparator input 430*a*, the comparator 430 may perform receiver trace issue signal transmission operations 802 that may include generating and transmitting a receiver trace issue signal (e.g., a high pulse) to the FPGA 404 via the comparator output 430*c*. As will be appreciated by one of skill in the art in possession of the present disclosure, in optional embodiments that include the indicator device 434, the receiver trace issue signal/high signal transmitted to the FPGA 404 via the comparator output 430*c* may be received by the indicator device 434, which may be configured to illuminate in response to a receiver trace issue signal/high pulse from the comparator 430.

In an embodiment, at block 508 and in response to the comparator 438 determining that the second test voltage detected at the comparator input 438*b* is above the reference test voltage received from the reference voltage subsystem 426 at the comparator input 438*a*, the comparator 438 may perform receiver trace issue signal transmission operations 802 that may include generating and transmitting a receiver trace issue signal (e.g., a high pulse) to the FPGA 404 via the comparator output 438*c*. As will be appreciated by one of skill in the art in possession of the present disclosure, in optional embodiments that include the indicator device 442, the receiver trace issue signal/high pulse transmitted to the FPGA 404 via the comparator output 438*c* may be received by the indicator device 442, which may be configured to illuminate in response to a receiver trace issue signal/high pulse from the comparator 438. As such, the receiver test circuit 424 may be configured to test receiver traces in a receiver differential trace pair and, in the event the second test voltage detected at the receiver test circuit is above the reference test voltage, the receiver test circuit may indicate an issue with the corresponding receiver trace by outputting a receiver trace issue signal/high pulse.

Figure 8E:
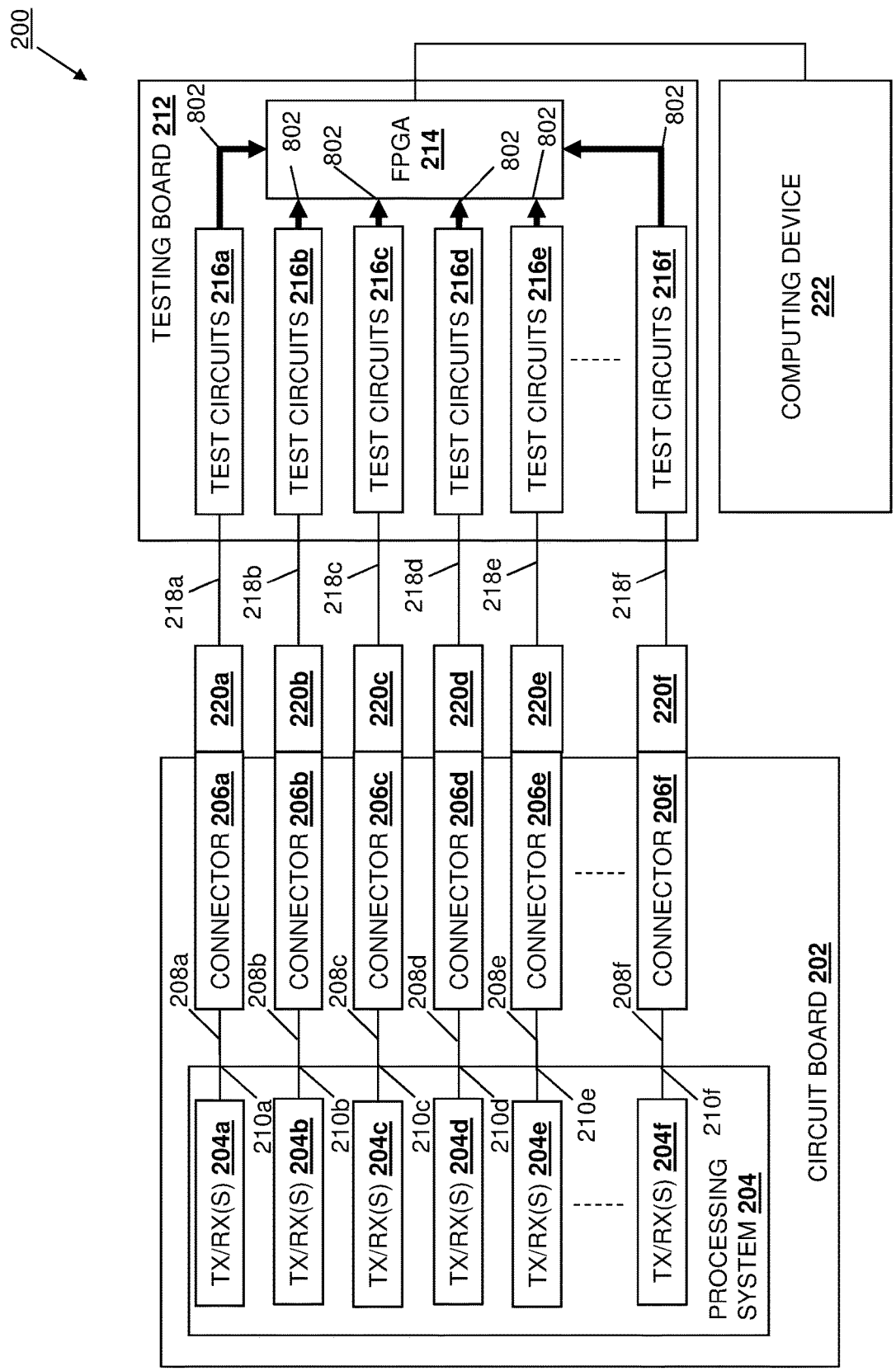
FIG. 8E is a schematic view illustrating an embodiment of the high-speed signal subsystem testing system of FIG. 2 operating during the method of FIG. 5.
Figure 8F:
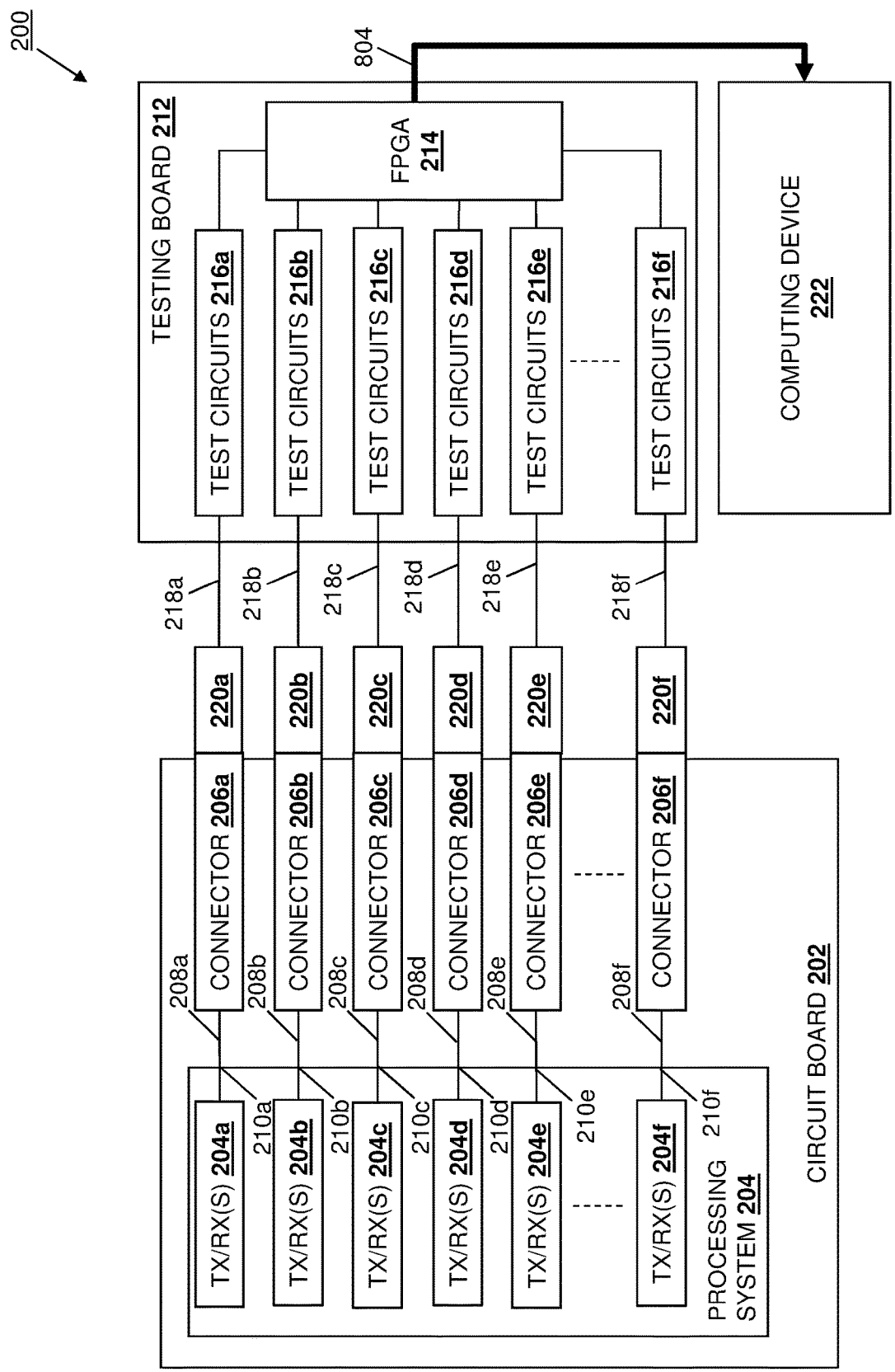
FIG. 8F is a schematic view illustrating an embodiment of the high-speed signal subsystem testing system of FIG. 2 operating during the method of FIG. 5.

As such, as illustrated in FIG. 8E, any of the test circuits 216*a*-216*f* that determine that a second test voltage detected at the receive test circuit 424 is above a reference test voltage may perform receiver trace issue signal transmission operations 802 to transmit a corresponding receiver trace issue signal/high pulse associated with the high-speed signal subsystem for the corresponding receiver trace, thus allowing the FPGA 214 to receive receiver trace issue signal/high pulse for any receiver traces with high-speed signal subsystems that are experiencing issues. With reference to FIG. 8F, the FPGA 214 may receive receiver trace issue signal(s)/high pulse(s) from the receiver test circuit(s) 216*a*-216*f* and, in response, may perform trace issue signal information generation/transmission operations 804 to generate and transmit trace issue signal information to the computing device 222. For example, the trace issue signal information may consolidate the receiver trace issue signal(s)/high pulse(s) received from the receiver test circuit(s) 216*a*-216*f*, and the computing device 222 may be configured to provide that trace issue signal information for display on a display device (e.g., the display 110 discussed above with reference to FIG. 1). As will be appreciated by one of skill in the art in possession of the present disclosure, the number of traces being tested (e.g., 1024 transmitter and receiver traces in the specific example described above) may complicate the provisioning of indicator devices for each of those traces, and thus the transmission of the trace issue signal information to the computing device 222 may provide particular benefits when testing circuit boards with relatively large numbers of traces Thus, systems and methods have been described that for the testing of a transmitter trace on a circuit board, the connection of that transmitter trace to a receiver in an NPU via a pad on the circuit board to which the NPU is mounted, the connection of that transmitter trace to a connector on the circuit board, and the connector, without having to assemble the circuit board as part of the switch device in which it will be provided. For example, the high-speed signal subsystem testing system of the present disclosure tests an NPU transmitter coupled to a connector via a transmitter trace. A transmitter test circuit on a testing board coupled to the connector compares a transmitter voltage received from the transmitter via the transmitter trace and the connector to a common mode voltage range and, in response to the transmitter voltage being outside the common mode voltage range, provides a transmitter trace issue signal. As such, transmitter traces on circuit boards may be tested to determine whether any portion of the high-speed signal subsystem associated with that transmitter trace is experiencing issues that would prevent its desired operation.

The systems and methods of the present disclosure also provide for the testing of a receiver trace on a circuit board, the connection of that receiver trace to a receiver in an NPU via a pad on the circuit board to which the NPU is mounted, the connection of that receiver trace to a connector on the circuit board, and the connector, without having to assemble the circuit board as part of the switch device in which it will be provided. For example, the high-speed signal subsystem testing system of the present disclosure tests an NPU receiver coupled to a connector via a receiver trace. A receiver test circuit on a testing board coupled to the connector transmits a first test voltage towards the receiver, compares a second test voltage detected at the receiver test circuit in response to the transmission of the first test voltage towards the receiver to a reference test voltage and, in response to the second test voltage being above the reference test voltage, provides a receiver trace issue signal. As such, receiver traces on circuit boards may be tested to determine whether any portion of the high-speed signal subsystem associated with that receiver trace is experiencing issues that would prevent its desired operation.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A high-speed signal subsystem testing system, comprising:
    a circuit board including:
        a processing system having a transmitter and a receiver; and
        a connector that is coupled to the transmitter via a first transmitter trace that is included on the circuit board, and to the receiver via a first receiver trace that is included on the circuit board; and a testing board including:
  a first transmitter test circuit that is coupled to the first transmitter trace via the connector and that is configured to:
    compare a first transmitter voltage received from the transmitter via the first transmitter trace and the connector to a common mode voltage range; and
    provide, in response to the first transmitter voltage received via the first transmitter trace being outside the common mode voltage range, a first transmitter trace issue signal that is configured to indicate an issue associated with the first transmitter trace;
  a first receiver test circuit that is coupled to the first receiver trace via the connector and that is configured to:
    generate a first test voltage and transmit the first test voltage towards the first receiver trace coupled to the connector;
    compare, to a reference test voltage, a second test voltage that is detected at the first receiver test circuit in response to generating and transmitting the first test voltage towards the first receiver trace coupled to the connector; and
    provide, in response to the second test voltage being above the reference test voltage, a first receiver trace issue signal that is configured to indicate an issue associated with the first receiver trace.

2. The system of claim 1, wherein the test voltage is a test voltage pulse.

3. The system of claim 1, wherein the connector is coupled to the transmitter via a transmitter differential trace pair that includes the first transmitter trace and a second transmitter trace that is included on the circuit board, and wherein the first transmitter test circuit is coupled to the second transmitter trace via the connector and is configured to:
  compare a second transmitter voltage received from the transmitter via the second transmitter trace and the connector to the common mode voltage range; and
  provide, in response to the second transmitter voltage received via the second transmitter trace being outside the common mode voltage range, a second transmitter trace issue signal that is configured to indicate an issue associated with the second transmitter trace.

4. The system of claim 1, wherein the connector is coupled to the receiver via a receiver differential trace pair that includes the first receiver trace and a second receiver trace that is included on the circuit board, and wherein the first receiver test circuit is coupled to the second receiver trace via the connector and is configured to:
  generate the first test voltage and transmit the first test voltage towards the second receiver trace coupled to the connector;
  compare, to the reference test voltage, a third test voltage that is detected at the first receiver test circuit in response to generating and transmitting the first test voltage towards the second receiver trace coupled to the connector; and
  provide, in response to the third test voltage being above the reference test voltage, a second receiver trace issue signal that is configured to indicate an issue associated with the second receiver trace.

5. The system of claim 1, wherein the testing board includes:
  a logic device that is configured to receive trace issue signals from the first transmitter test circuit and the first receiver test circuit and, in response, generate and transmit trace issue signal information.

6. The system of claim 5, further comprising:
  a computing device that is coupled to the testing board and that is configured to:
    receive the trace issue signal information from the logic device; and
    provide, for display on the computing device using the trace issue signal information, an identification of at least one trace issue.

7. The system of claim 1, wherein the first transmitter trace issue signal is configured to indicate the issue with at least one of the first transmitter trace, a first processing system connection that connects the first transmitter trace to the transmitter, or a first pin on the connector that is connected to the first transmitter trace, and wherein the first receiver trace issue signal that is configured to indicate an issue with at least one of the first receiver trace, a second processing system connection that connects the first transmitter trace to the transmitter, or a second pin on the connector that is connected to the first receiver trace.

8. An Information Handling System (IHS), comprising:
  a testing board;
  a first transmitter test circuit that is included on the testing board and that is configured to couple to a transmitter in a processing system on a circuit board via a connector and a first transmitter trace that are included on the circuit board, wherein the first transmitter test circuit is configured to:
    compare a first transmitter voltage received from the transmitter via the first transmitter trace and the connector to a common mode voltage range; and
    provide, in response to the first transmitter voltage received via the first transmitter trace being outside the common mode voltage range, a first transmitter trace issue signal that is configured to indicate an issue associated with the first transmitter trace; and
  a first receiver test circuit that is included on the testing board and that is configured to couple to a receiver in the processing system on the circuit board via the connector and a first receiver trace that are included on the circuit board, wherein the first receiver test circuit is configured to:
    generate a first test voltage and transmit the first test voltage towards the first receiver trace coupled to the connector;
    compare, to a reference test voltage, a second test voltage that is detected at the first receiver test circuit in response to generating and transmitting the first test voltage towards the first receiver trace coupled to the connector; and
    provide, in response to the second test voltage being above the reference test voltage, a first receiver trace issue signal that is configured to indicate an issue associated with the first receiver trace.

9. The IHS of claim 8, wherein the test voltage is a test voltage pulse.

10. The IHS of claim 8, wherein the first transmitter test circuit is configured to couple to the transmitter in the processing system on the circuit board via the connector and a transmitter differential trace pair that includes the first transmitter trace and a second transmitter trace that is included on the circuit board, and wherein the first transmitter test circuit is configured to:
  compare a second transmitter voltage received from the transmitter via the second transmitter trace and the connector to the common mode voltage range; and provide, in response to the second transmitter voltage received via the second transmitter trace being outside the common mode voltage range, a second transmitter trace issue signal that is configured to indicate an issue associated with the second transmitter trace.

11. The IHS of claim 8, wherein the first receiver test circuit is configured to couple to the receiver in the processing system on the circuit board via the connector and a receiver differential trace pair that includes the first receiver trace and a second receiver trace that is included on the circuit board, and wherein the first receiver test circuit is configured to:
generate the first test voltage and transmit the first test voltage towards the second receiver trace coupled to the connector;
compare, to the reference test voltage, a third test voltage that is detected at the first receiver test circuit in response to generating and transmitting the first test voltage towards the second receiver trace coupled to the connector; and
provide, in response to the third test voltage being above the reference test voltage, a second receiver trace issue signal that is configured to indicate an issue associated with the second receiver trace.

12. The IHS of claim 8, wherein the testing board includes:
a logic device that is configured to receive trace issue signals from the first transmitter test circuit and the first receiver test circuit and, in response, generate and transmit trace issue signal information.

13. The IHS of claim 7, wherein the first transmitter trace issue signal is configured to indicate the issue with at least one of the first transmitter trace, a first processing system connection that connects the first transmitter trace to the transmitter, or a first pin on the connector that is connected to the first transmitter trace, and wherein the first receiver trace issue signal that is configured to indicate an issue with at least one of the first receiver trace, a second processing system connection that connects the first transmitter trace to the transmitter, or a second pin on the connector that is connected to the first receiver trace.

14. A method for testing high-speed signaling subsystem, comprising:
comparing, by a first transmitter test circuit that is included on a testing board and that is coupled to a transmitter in a processing system on a circuit board via a connector and a first transmitter trace that are included on the circuit board, a first transmitter voltage received from the transmitter via the first transmitter trace and the connector to a common mode voltage range;
providing, by the first transmitter test circuit in response to the first transmitter voltage received via the first transmitter trace being outside the common mode voltage range, a first transmitter trace issue signal that is configured to indicate an issue associated with the first transmitter trace;
generating, by a first receiver test circuit that is included on the testing board and that is coupled to a receiver in the processing system on the circuit board via the connector and a first receiver trace that are included on the circuit board, a first test voltage and transmit the first test voltage towards the first receiver trace coupled to the connector;
comparing, by the first receiver test circuit to a reference test voltage, a second test voltage that is detected at the first receiver test circuit in response to generating and transmitting the first test voltage towards the first receiver trace coupled to the connector; and
providing, by the first receiver test circuit in response to the second test voltage being above the reference test voltage, a first receiver trace issue signal that is configured to indicate an issue associated with the first receiver trace.

15. The method of claim 14, wherein the test voltage is a test voltage pulse.

16. The method of claim 14, further comprising:
comparing, by the first transmitter test circuit that is coupled to the transmitter in the processing system on the circuit board via the connector and a transmitter differential trace pair that includes the first transmitter trace and a second transmitter trace that is included on the circuit board, a second transmitter voltage received from the transmitter via the second transmitter trace and the connector to the common mode voltage range; and
providing, by the first transmitter test circuit in response to the second transmitter voltage received via the second transmitter trace being outside the common mode voltage range, a second transmitter trace issue signal that is configured to indicate an issue associated with the second transmitter trace.

17. The method of claim 14, further comprising:
generating, by the first receiver test circuit that is coupled to the receiver in the processing system on the circuit board via the connector and a receiver differential trace pair that includes the first receiver trace and a second receiver trace that is included on the circuit board, the first test voltage and transmitting the first test voltage towards the second receiver trace coupled to the connector;
comparing, by the first receiver test circuit to the reference test voltage, a third test voltage that is detected at the first receiver test circuit in response to generating and transmitting the first test voltage towards the second receiver trace coupled to the connector; and
providing, by the first receiver test circuit in response to the third test voltage being above the reference test voltage, a second receiver trace issue signal that is configured to indicate an issue associated with the second receiver trace.

18. The method of claim 14, further comprising:
receiving, by a logic device that is included on the testing board, trace issue signals from the first transmitter test circuit and the first receiver test circuit and, in response, generating and transmitting trace issue signal information.

19. The method of claim 18, further comprising:
receiving, by a computing device that is coupled to the testing board, the trace issue signal information from the logic device; and
providing, by the computing device for display on the computing device using the trace issue signal information, an identification of at least one trace issue.

20. The method of claim 14, wherein the first transmitter trace issue signal is configured to indicate the issue with at least one of the first transmitter trace, a first processing system connection that connects the first transmitter trace to the transmitter, or a first pin on the connector that is connected to the first transmitter trace, and wherein the first receiver trace issue signal that is configured to indicate an issue with at least one of the first receiver trace, a second processing system connection that connects the first transmitter trace to the transmitter, or a second pin on the connector that is connected to the first receiver trace.

* * * * *